(12) United States Patent
Seo et al.

(10) Patent No.: US 12,185,558 B2
(45) Date of Patent: Dec. 31, 2024

(54) LIGHT-EMITTING DEVICE, LIGHT-EMITTING APPARATUS, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Harue Osaka, Kanagawa (JP); Naoaki Hashimoto, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 573 days.

(21) Appl. No.: 17/431,517

(22) PCT Filed: Feb. 12, 2020

(86) PCT No.: PCT/IB2020/051103
§ 371 (c)(1),
(2) Date: Aug. 17, 2021

(87) PCT Pub. No.: WO2020/170074
PCT Pub. Date: Aug. 27, 2020

(65) Prior Publication Data
US 2022/0149308 A1  May 12, 2022

(30) Foreign Application Priority Data

Feb. 20, 2019 (JP) .................. 2019-028421

(51) Int. Cl.
*H10K 50/11* (2023.01)
*H10K 50/15* (2023.01)
(Continued)

(52) U.S. Cl.
CPC ............ *H10K 50/11* (2023.02); *H10K 50/15* (2023.02); *H10K 50/16* (2023.02); *H10K 50/171* (2023.02);
(Continued)

(58) Field of Classification Search
CPC ........ H10K 50/11; H10K 50/15; H10K 50/16; H10K 50/171; H10K 2101/30; H10K 2101/40
See application file for complete search history.

(56) References Cited

U.S. PATENT DOCUMENTS 6,229,505 B1  5/2001  Fujii
7,973,467 B2  7/2011  Song et al.
(Continued)

FOREIGN PATENT DOCUMENTS

CN   101436645 A   5/2009
CN   101803057 A   8/2010
(Continued)

OTHER PUBLICATIONS

Liao, S. et al., "Hydroxynaphthyridine-Derived Group III Metal Chelates: Wide Band Gap and Deep Blue Analogues of Green Alq3 (tris(8-hydroxyquinolate)aluminum) and Their Versatile Applications for Organic Light- Emitting Diodes," Journal of the American Chemical Society, 2009, vol. 131, No. 2, pp. 763-777.
(Continued)

*Primary Examiner* — Jay C Kim
*Assistant Examiner* — Woo K Lee
(74) *Attorney, Agent, or Firm* — Husch Blackwell LLP

(57) ABSTRACT

A light-emitting device with a long lifetime is provided. In a light-emitting device that includes an EL layer between a pair of electrodes, a light-emitting layer included in the EL
(Continued)

layer has a functional stacked-layer structure, whereby the efficiency and reliability of the light-emitting device can be increased.

6 Claims, 13 Drawing Sheets

(51) Int. Cl.
    *H10K 50/16*     (2023.01)
    *H10K 50/17*     (2023.01)
    *H10K 101/30*     (2023.01)
    *H10K 101/40*     (2023.01)

(52) U.S. Cl.
    CPC ..... *H10K 2101/30* (2023.02); *H10K 2101/40* (2023.02)

(56) References Cited

U.S. PATENT DOCUMENTS

| | | | |
|---|---|---|---|
| 8,299,458 B2 | 10/2012 | Terao et al. | |
| 8,841,655 B2 | 9/2014 | Okamoto | |
| 10,818,861 B2* | 10/2020 | Seo | H10K 50/121 |
| 10,950,805 B2 | 3/2021 | Watabe et al. | |
| 2009/0128012 A1 | 5/2009 | Song et al. | |
| 2009/0236590 A1* | 9/2009 | Ohsawa | H10K 85/633 257/E51.026 |
| 2011/0233525 A1 | 9/2011 | Terao et al. | |
| 2015/0236075 A1 | 8/2015 | Jeong | |
| 2021/0249619 A1 | 8/2021 | Seo et al. | |
| 2021/0257562 A1 | 8/2021 | Watabe et al. | |

FOREIGN PATENT DOCUMENTS

| | | |
|---|---|---|
| DE | 11 2008 002 449 T5 | 10/2010 |
| EP | 2 061 104 A1 | 5/2009 |
| EP | 2879196 A | 6/2015 |
| JP | 11-185957 A | 7/1999 |
| JP | 2009-124138 A | 6/2009 |
| JP | 2015-203027 A | 11/2015 |
| KR | 2009-0050369 A | 5/2009 |
| KR | 2010-0095504 A | 8/2010 |
| KR | 2015-0098259 A | 8/2015 |
| TW | 200921965 | 5/2009 |
| TW | 200935639 | 8/2009 |
| WO | WO 2009/069434 A1 | 6/2009 |
| WO | WO 2011/065136 A1 | 6/2011 |
| WO | WO-2014/017484 | 1/2014 |

OTHER PUBLICATIONS

International Search Report (Application No. PCT/IB2020/051103) Dated May 26, 2020.

Written Opinion (Application No. PCT/IB2020/051103) Dated May 26, 2020.

Okachi, T. et al., "Determination of Charge-Carrier Mobility in Organic Light-Emitting Diodes by Impedance Spectroscopy in Presence of Localized States," Japanese Journal of Applied Physics, Dec. 19, 2008, vol. 47, No. 12, pp. 8965-8972.

* cited by examiner

LIGHT-EMITTING DEVICE, LIGHT-EMITTING APPARATUS, ELECTRONIC DEVICE, AND LIGHTING DEVICE

This application is a 371 of international application PCT/IB2020/051103 filed on Feb. 12, 2020 which is incorporated herein by reference.

TECHNICAL FIELD

Embodiments of the present invention relate to a light-emitting element, a light-emitting device, a display module, a lighting module, a display device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

BACKGROUND ART

Light-emitting devices (organic EL elements) utilizing electroluminescence (EL) using organic compounds have increasingly been put into practical use. In the basic structure of such light-emitting devices, an organic compound layer containing a light-emitting substance (an EL layer) is sandwiched between a pair of electrodes. Carriers are injected by application of voltage to the element, and recombination energy of the carriers is used, whereby light emission from the light-emitting substance can be obtained.

Such light-emitting devices are of self-light-emitting type and thus have advantages over liquid crystal, such as high visibility and no need for backlight when used for pixels of a display, and are suitable as flat panel display elements. Displays using such light-emitting devices are also highly advantageous in that they can be thin and lightweight. Moreover, an extremely fast response speed is also a feature.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be applied to lighting devices and the like.

Displays and lighting devices using light-emitting devices can be suitably used for a variety of electronic devices as described above, and research and development of light-emitting devices have progressed for higher efficiency and longer lifetime.

In a structure disclosed in Patent Document 1, a hole-transport material whose HOMO level is between the HOMO level of a first hole-injection layer and the HOMO level of a host material is provided between a light-emitting layer and a first hole-transport layer in contact with the hole-injection layer.

The characteristics of light-emitting devices have been improved considerably, but are still insufficient to satisfy advanced requirements for various characteristics such as efficiency and durability.

REFERENCE

Patent Document

[Patent Document 1] PCT International Publication No. WO2011/065136

SUMMARY OF THE INVENTION

Problems to be Solved by the Invention

In view of the above, an object of one embodiment of the present invention is to provide a novel light-emitting device. Another object is to provide a light-emitting device with high emission efficiency. Another object is to provide a light-emitting device with a long lifetime. Another object is to provide a light-emitting device with low driving voltage.

An object of another embodiment of the present invention is to provide a light-emitting apparatus, an electronic device, and a display device each having high reliability. An object of another embodiment of the present invention is to provide a light-emitting apparatus, an electronic device, and a display device each having low power consumption.

It is only necessary that at least one of the above-described objects be achieved in the present invention.

Means for Solving the Problems

In one embodiment of the present invention, in a light-emitting device that includes an EL layer between a pair of electrodes, a light-emitting layer included in the EL layer has a functional stacked-layer structure; thus, the reliability and emission efficiency of the light-emitting device can be increased.

One embodiment of the present invention is a light-emitting device including an EL layer between an anode and a cathode. The EL layer includes a hole-injection layer, a hole-transport layer, a light-emitting layer, and an electron-transport layer from the anode side. The hole-injection layer is in contact with the anode. The light-emitting layer includes a first light-emitting layer and a second light-emitting layer that are stacked from the anode side. The first light-emitting layer is in contact with the hole-transport layer. The second light-emitting layer is in contact with the electron-transport layer. The first light-emitting layer includes a first substance and a second substance. The second light-emitting layer includes a third substance and a fourth substance. The first substance and the third substance are the same light-emitting substance or different light-emitting substances. The second substance and the fourth substance are the same substance or different substances. The hole-injection layer includes a fifth substance and a sixth substance. The fifth substance is an acceptor material. The sixth substance has a HOMO level higher than or equal to $-5.7$ eV and lower than or equal to $-5.4$ eV. The hole-transport layer includes a seventh substance. The seventh substance has a HOMO level lower than the HOMO level of the sixth substance and higher than the HOMO level of the second substance. The electron-transport layer includes an eighth substance and a ninth substance. The eighth substance is an organometallic complex of an alkali metal or an alkaline earth metal. The ninth substance has a HOMO level higher than or equal to −6.0 eV, and has an electron mobility higher than or equal to $1\times10^{-7}$ cm$^2$/Vs and lower than or equal to $5\times10^{-5}$ cm$^2$/Vs when the square root of electric field strength [V/cm] is 600.

Another embodiment of the present invention is a light-emitting device including an EL layer between an anode and a cathode. The EL layer includes a hole-injection layer, a hole-transport layer, a light-emitting layer, and an electron-transport layer from the anode side. The hole-injection layer is in contact with the anode. The light-emitting layer includes a first light-emitting layer and a second light-emitting layer that are stacked from the anode side. The first light-emitting layer is in contact with the hole-transport layer. The second light-emitting layer is in contact with the electron-transport layer. The first light-emitting layer includes a first substance and a second substance. The second light-emitting layer includes a third substance and a fourth substance. The first substance and the third substance are the same light-emitting substance or different light-emitting substances. The second substance and the fourth substance are the same substance. The hole-injection layer includes a fifth substance and a sixth substance. The fifth substance is an acceptor material. The sixth substance has a HOMO level higher than or equal to −5.7 eV and lower than or equal to −5.4 eV. The hole-transport layer includes a seventh substance. The seventh substance has a HOMO level lower than the HOMO level of the sixth substance and higher than the HOMO level of the second substance. The electron-transport layer includes an eighth substance and a ninth substance. The eighth substance is an organometallic complex of an alkali metal or an alkaline earth metal. The ninth substance has a HOMO level higher than or equal to −6.0 eV, and has an electron mobility higher than or equal to $1\times10^{-7}$ cm$^2$/Vs and lower than or equal to $5\times10^{-5}$ cm$^2$/Vs when the square root of electric field strength [V/cm] is 600.

In the light-emitting device having each of the above structures, it is preferred that each of the first light-emitting layer and the second light-emitting layer emits blue light.

In the light-emitting device having each of the above structures, it is preferred that the ratio of the eighth substance to the ninth substance in the electron-transport layer differ between the cathode side and the second light-emitting layer side.

In the light-emitting device having each of the above structures, it is preferred that the proportion of the eighth substance in the electron-transport layer be lower on the cathode side than on the second light-emitting layer side.

Note that the light-emitting apparatus in this specification includes, in its category, an image display device that uses a light-emitting device. The light-emitting apparatus may also include, in its category, a module in which a light-emitting device is provided with a connector such as an anisotropic conductive film or a TCP (Tape Carrier Package), a module in which a printed wiring board is provided at the end of a TCP, and a module in which an IC (integrated circuit) is directly mounted on a light-emitting device by a COG (Chip On Glass) method.

Furthermore, in some cases, a lighting device or the like includes the light-emitting apparatus.

Effect of the Invention

According to one embodiment of the present invention, a novel light-emitting device can be provided. A light-emitting device with a long lifetime can be provided. A light-emitting device with high emission efficiency can be provided. According to another embodiment of the present invention, a light-emitting apparatus, an electronic device, and a display device each having high reliability can be provided. According to another embodiment of the present invention, a light-emitting apparatus, an electronic device, and a display device each having low power consumption can be provided.

Note that the description of these effects does not preclude the existence of other effects. One embodiment of the present invention does not have to have all of these effects. Note that effects other than these will be apparent from the description of the specification, the drawings, the claims, and the like, and effects other than these can be derived from the description of the specification, the drawings, the claims, and the like.

MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Embodiment 1

In this embodiment, a structure of a light-emitting device of one embodiment of the present invention will be described with reference to FIG. 1.

Figure 1:
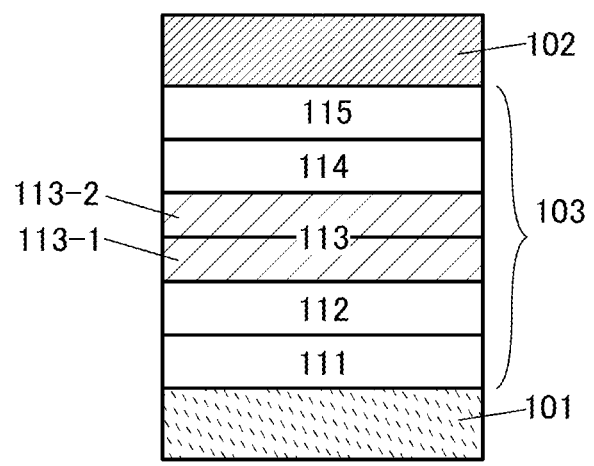
FIG. 1 is a diagram illustrating a structure of a light-emitting device.

FIG. 1 illustrates a light-emitting device having a structure in which an EL layer 103 is sandwiched between a first electrode 101 functioning as an anode and a second electrode 102 functioning as a cathode. Accordingly, the EL layer 103 has a structure in which a hole-injection layer 111, a hole-transport layer 112, a light-emitting layer 113, an electron-transport layer 114, and an electron-injection layer 115 are sequentially stacked as functional layers.

In the light-emitting device of one embodiment of the present invention, the light-emitting layer 113 included in the EL layer 103 has a stacked-layer structure. FIG. 1 illustrates the case where the light-emitting layer 113 has a two-layer structure in which a first light-emitting layer 113-1 and a second light-emitting layer 113-2 are stacked. Note that the number of layers stacked in the light-emitting layer 113 is not limited to two, and the light-emitting layer 113 can have any structure that can provide a function required for the light-emitting layer 113 as one embodiment of the present invention.

Note that the function required for the light-emitting layer 113 is a function of increasing the recombination rate of carriers (holes and electrons) in the light-emitting layer 113.

In the light-emitting device of one embodiment of the present invention, providing a plurality of light-emitting layers having different carrier-transport properties can control carrier balance, increase the recombination rate of carriers in the light-emitting layer, and prevent deterioration of the functional layers included in the EL layer; thus, the light-emitting device can have high reliability and high emission efficiency.

In one embodiment of the present invention, in the light-emitting layer 113 having the stacked-layer structure, a host material used in the first light-emitting layer 113-1 and a host material used in the second light-emitting layer 113-2 may be different materials. A guest material used in the first light-emitting layer 113-1 and a guest material used in the second light-emitting layer 113-2 may be different materials. One of the guest material and the host material may be the same material in the first light-emitting layer 113-1 and the second light-emitting layer 113-2. One or more kinds of host materials may be used in the first light-emitting layer 113-1 and the second light-emitting layer 113-2. In the case where a plurality of host materials are used in the first light-emitting layer 113-1 and the second light-emitting layer 113-2, these host materials in combination may form an exciplex. Note that the carrier-transport properties of the first light-emitting layer 113-1 and the second light-emitting layer 113-2 may be controlled with the host material used in each layer, may be controlled with the guest material, or may be controlled with a combination of the host material and the guest material.

The light-emitting layers having different carrier-transport properties are stacked as described above, whereby light emission can be controlled to be obtained at the interface between the stacked light-emitting layers. Moreover, light-emitting layers using different guest materials may be stacked so that energy can be transferred between these light-emitting layers and the emission efficiency is increased.

In one embodiment of the present invention, in the light-emitting layer 113 having the stacked-layer structure, the light-emitting layers may be formed such that the second light-emitting layer 113-2 has a lower hole mobility than the first light-emitting layer 113-1, and the recombination region may be controlled to be located around the interface between the first light-emitting layer 113-1 and the second light-emitting layer 113-2. With such a structure, the emission efficiency of the light-emitting device can be increased. Alternatively, in the light-emitting layer 113 having the stacked-layer structure, the light-emitting layers may be formed such that the second light-emitting layer has a higher electron mobility than the first light-emitting layer. Alternatively, these structures may be combined. Note that the carrier mobility such as the hole mobility and the electron mobility can be obtained by impedance spectroscopy.

In the light-emitting layer 113 having the stacked-layer structure, the concentration of the guest material contained in the second light-emitting layer 113-2 may be lower than the concentration of the guest material contained in the first light-emitting layer 113-1 (e.g., the concentration of the guest material contained in the second light-emitting layer 113-2 is 3 w % or less, preferably 2 w % or less) so that the carrier recombination region may be controlled to be located around the interface between the first light-emitting layer and the second light-emitting layer. With such a structure, the emission efficiency of the light-emitting device can be increased. This is because in the case where the HOMO level of the guest material is shallower than the HOMO level of the host material and oxidation is likely to occur (the difference in HOMO level is 0.2 eV, preferably 0.3 eV or more in CV measurement), the guest material traps holes when the concentration of the guest material is low, and holes are transported easily when the concentration of the guest material is high. Note that the difference can be confirmed as a resistance change by impedance spectroscopy or the like.

In the light-emitting layer 113 having the stacked-layer structure, the light-emitting layers may be formed such that the second light-emitting layer 113-2 has a higher hole mobility than the first light-emitting layer 113-1, and the carrier recombination region at the initial stage of driving may be located closer to the second light-emitting layer 113-2 than to the interface between the stacked layers. With such a structure, reliability at the initial stage (5% or 10% luminance decrease) can be extended. Alternatively, the light-emitting layers may be formed such that the second light-emitting layer 113-2 has a lower electron mobility than the first light-emitting layer 113-1. Alternatively, these structures may be combined. Note that these carrier mobilities can be obtained by impedance spectroscopy.

In the light-emitting layer 113 having the stacked-layer structure, the light-emitting layers may be formed such that the second light-emitting layer 113-2 has a lower electric resistance than the first light-emitting layer 113-1, and the carrier recombination region at the initial stage of driving may be located closer to the second light-emitting layer 113-2 than to the interface between the stacked layers. With such a structure, the reliability of the light-emitting device at the initial stage of driving (5% or 10% luminance decrease) can be increased. Note that the electric resistance can be obtained by impedance spectroscopy.

In the light-emitting layer 113 having the stacked-layer structure, the light-emitting layers may be formed such that the second light-emitting layer 113-2 has a higher anisotropy of the refractive index with respect to a substrate surface than the first light-emitting layer 113-1, and the carrier recombination region at the initial stage of driving may be located closer to the second light-emitting layer 113-2 than to the interface between the stacked layers. With such a structure, the reliability at the initial stage of driving (5% or 10% luminance decrease) can be increased. This is because carriers can be easily transported when the transition dipole moment is horizontal to the substrate. Note that the concentration of the guest material in the second light-emitting layer 113-2 at this time is preferably 2 w % or more. The carrier mobility can be obtained by impedance spectroscopy. The anisotropy of the refractive index with respect to a substrate surface can be obtained by spectroscopic ellipsometry.

Embodiment 2

In this embodiment, an example of a light-emitting device of one embodiment of the present invention will be described.

<Structure Example of Light-Emitting Device>

Figure 2A:
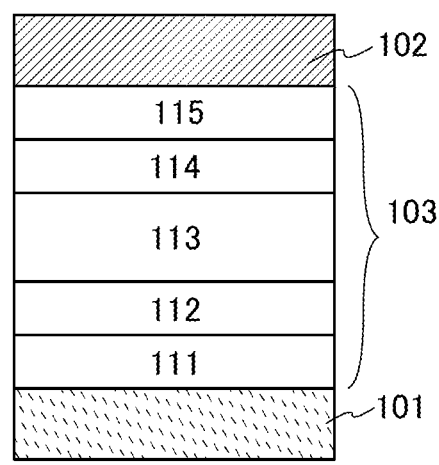
FIG. 2A and FIG. 2B are diagrams illustrating structures of light-emitting devices.

FIG. 2A illustrates an example of a light-emitting device including, between a pair of electrodes, an EL layer having a light-emitting layer. Specifically, the light-emitting device has a structure in which the EL layer 103 is sandwiched between the first electrode 101 and the second electrode 102. For example, in the case where the first electrode 101 serves as an anode, the EL layer 103 has a structure in which the hole-injection layer 111, the hole-transport layer 112, the light-emitting layer 113, the electron-transport layer 114, and the electron-injection layer 115 are sequentially stacked as functional layers.

Embodiments of the present invention also include light-emitting devices having other structures, for example, a light-emitting device that can be driven at a low voltage by having a structure in which a plurality of EL layers, between which a charge-generation layer is sandwiched, are provided between a pair of electrodes (a tandem structure), and a light-emitting device that has improved optical characteristics by having a micro-optical resonator (microcavity) structure between a pair of electrodes. Note that the charge-generation layer has a function of injecting electrons into one of the adjacent EL layers and injecting holes into the other of the EL layers when a voltage is applied to the first electrode 101 and the second electrode 102.

Note that at least one of the first electrode 101 and the second electrode 102 of the above light-emitting device is an electrode having a light-transmitting property (e.g., a transparent electrode or a transflective electrode). In the case where the electrode having a light-transmitting property is a transparent electrode, the visible light transmittance of the transparent electrode is 40% or higher. In the case where the electrode having a light-transmitting property is a transflective electrode, the visible light reflectance of the transflective electrode is higher than or equal to 20% and lower than or equal to 80%, preferably higher than or equal to 40% and lower than or equal to 70%. The resistivity of these electrodes is preferably $1 \times 10^{-2}$ Ωcm or lower.

In the case where one of the first electrode 101 and the second electrode 102 is an electrode having reflectivity (a reflective electrode) in the above light-emitting device of one embodiment of the present invention, the visible light reflectance of the electrode having reflectivity is higher than or equal to 40% and lower than or equal to 100%, preferably higher than or equal to 70% and lower than or equal to 100%. The resistivity of this electrode is preferably $1 \times 10^{-2}$ Ωcm or lower.

<First Electrode and Second Electrode>

As materials for forming the first electrode 101 and the second electrode 102, any of the following materials can be used in an appropriate combination as long as the functions of the electrodes described above can be fulfilled. For example, a metal, an alloy, an electrically conductive compound, and a mixture of these can be used as appropriate. Specific examples include In—Sn oxide (also referred to as ITO), In—Si—Sn oxide (also referred to as ITSO), In—Zn oxide, and In—W—Zn oxide. It is also possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 in the periodic table, which is not listed above as an example (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

For fabrication of these electrodes, a sputtering method or a vacuum evaporation method can be used.

<Hole-Injection Layer>

The hole-injection layer 111 is a layer including an organic acceptor material and a hole-transport material with a deep HOMO level. The organic acceptor material exhibits an electron-accepting property with respect to the hole-transport material with a deep HOMO level. The hole-transport material with a deep HOMO level is a substance that has a relatively deep HOMO level which is higher than or equal to −5.7 eV and lower than or equal to −5.4 eV. The hole-transport material with a relatively deep HOMO level allows easy hole injection into the hole-transport layer 112.

As the organic acceptor material, organic compounds having an electron-withdrawing group (in particular, a cyano group or a halogen group such as a fluoro group) can be used, for example. A substance that exhibits an electron-accepting property with respect to the second substance is selected from such substances as appropriate. Examples of such organic compounds include 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylen-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The above hole-transport material with a deep HOMO level is preferably a hole-transport material having a hole-transport property and preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of the amine through an arylene group may be used.

The hole-transport material with a deep HOMO level is preferably a substance having a hole mobility higher than or equal to $1 \times 10^{-6}$ cm$^2$/Vs in the case where the square root of the electric field strength [V/cm] is 600. Note that other substances can also be used as long as they have a property of transporting more holes than electrons. Note that the material is preferably a substance having an N,N-bis(4-biphenyl)amino group, in which case a light-emitting device with a long lifetime can be fabricated.

Specific examples of the hole-transport material with a deep HOMO level include N-(4-biphenyl)-6,N-diphenyl-benzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBA-Bnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBA-Bnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4"-{9-(4-biphenylyl)carbazole)}triphenylamine (abbreviation: YGTBiβNB), N-[4-(9-phenyl-9H-carbazol-3-yl)phenyl]-N-[4-(1-naphthyl)phenyl]-9,9'-spiro-bi(9H-fluoren)-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spiro-bi(9H-fluoren)-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), and N-(1,1'-biphenyl-4-yl)-9,9-dimethyl-N-[4-(9-phenyl-9H-carbazol-3-yl)phenyl]-9H-fluoren-2-amine (abbreviation: PCBBiF).

Note that the hole-injection layer 111 can be formed by any of various known deposition methods, and can be formed by a vacuum evaporation method, for example.

<Hole-Transport Layer>

The hole-transport layer 112 is a layer transporting holes, which are injected from the first electrode 101 by the hole-injection layer 111, to the light-emitting layer 113.

For the hole-transport layer 112, the above-described hole-transport material can be used. The hole-transport layer 112 may have a stacked-layer structure. Note that in the case where the hole-transport layer 112 has a stacked-layer structure, a layer on the light-emitting layer side may have a function of an electron-blocking layer.

When the HOMO level of the hole-transport material used in the hole-injection layer 111 and the HOMO level of the hole-transport material used in the hole-transport layer 112 are compared to each other, it is preferable that the materials be selected so that the HOMO level of the hole-transport material used in the hole-transport layer 112 is deeper than the HOMO level of the hole-transport material used in the hole-injection layer 111 and the difference between the HOMO levels is less than or equal to 0.2 eV. It is further preferable that these hole-transport materials be the same material, in which case holes can be injected smoothly.

In the case where the hole-transport layer 112 has a stacked-layer structure, when the HOMO level of the hole-transport material used in the hole-transport layer formed on the electron-injection layer 111 side and the HOMO level of the hole-transport material used in the hole-transport layer formed on the light-emitting layer 113 side are compared to each other, the latter HOMO level is preferably deeper than the former HOMO level. Furthermore, the materials are preferably selected so that the difference between the HOMO levels is less than or equal to 0.2 eV. Owing to the above-described relation between the HOMO levels of the hole-transport materials used in the hole-injection layer 111 and the hole-transport layer having a stacked-layer structure, holes are injected into each layer smoothly, which prevents an increase in driving voltage and deficiency of holes in the light-emitting layer 113.

Preferably, the hole-transport materials used in the hole-injection layer 111 and the hole-transport layer 112 having a stacked-layer structure each have a hole-transport skeleton. The hole-transport skeleton is preferably a carbazole skeleton, a dibenzofuran skeleton, a dibenzothiophene skeleton, and an anthracene skeleton, with which the HOMO levels of these hole-transport materials do not become too shallow. The hole-transport materials used for the adjacent layers in the hole-injection layer 111 and the hole-transport layer 112 having a stacked-layer structure preferably have the same hole-transport skeleton, in which case holes can be injected smoothly. In particular, the hole-transport skeleton for these layers is preferably a dibenzofuran skeleton.

The hole-transport materials used for the adjacent layers in the hole-injection layer 111 and the hole-transport layer 112 having a stacked-layer structure are preferably the same, in which case holes can be injected more smoothly into the adjacent layer in the cathode direction.

<Light-Emitting Layer>

In the light-emitting device of one embodiment of the present invention, the light-emitting layer 113 has a stacked-layer structure of a plurality of light-emitting layers. Note that the function of the plurality of light-emitting layers is as described in Embodiment 1, and the light-emitting layers can be formed using any of the following materials to fulfill the function.

The light-emitting layer 113 includes a light-emitting substance (a guest material) and a host material in which the light-emitting substance is dispersed.

Note that as the light-emitting substance (the guest material), a substance exhibiting fluorescence (a fluorescent material), a substance exhibiting phosphorescence (a phosphorescent material), a thermally activated delayed fluorescent (TADF) material exhibiting thermally activated delayed fluorescence, other light-emitting substances, or the like can be used. As the host material, various carrier-transport materials such as the TADF material as well as an electron-transport material and a hole-transport material can be used. Moreover, as the host material, a hole-transport material, an electron-transport material, or the like can be used. As a specific example of a hole-transport material, an electron-transport material, and the like, one or more kinds of the materials described in this specification and known materials can be used as appropriate.

Examples of the fluorescent substance that can be used as the guest material in the light-emitting layer 113 are as follows. Fluorescent substances other than those given below can also be used.

Examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis (3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenyl stilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p] chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone, (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DC-M2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H, 5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H, 5H-benzo[ij]quinolizin-9-yl)ethenyl]-4H-pyran-4-ylidene}propanedinitrile (abbreviation: DCJTB), 2-(2,6-bis {2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Examples of the phosphorescent substance that can be used as the guest material in the light-emitting layer 113 are as follows.

Examples include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); organometallic iridium complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic iridium complexes having an imidazole skeleton, such as fac-tris[(1-2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium (III) picolinate (abbreviation: [Ir(CF$_3$ppy)$_2$ (pic)]), and bis[2-(4',6'-difluorophenyl)pyridinato-N,C$^{2'}$]iridium(III) acetylacetonate (abbreviation: FIracac). These compounds exhibit blue phosphorescence and have an emission peak at 440 nm to 520 nm.

Other examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir (mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); and rare earth metal complexes such as tris(acetylacetonato) (monophenanthroline)terbium(III) (abbreviation: [Tb(acac)$_3$(Phen)]). These are mainly compounds that exhibit green phosphorescence and have an emission peak at 500 nm to 600 nm. Note that organometallic iridium complexes having a pyrimidine skeleton have distinctively high reliability and emission efficiency and thus are particularly preferable.

Other examples include organometallic iridium complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato](dipivaloylmethanato)iridium(III) (abbreviation: [Ir(d1npm)$_2$(dpm)]); organometallic iridium complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); organometallic iridium complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum (II) (abbreviation: PtOEP); and rare earth metal complexes such as tris(1,3-diphenyl-propanedionato) (monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]). These compounds exhibit red phosphorescence and have an emission peak at 600 nm to 700 nm. Furthermore, organometallic iridium complexes having a pyrazine skeleton can provide red light emission with favorable chromaticity.

Besides the above-described materials, known phosphorescent substances can also be used.

Examples of the TADF material that can be used as the guest material in the light-emitting layer 113 are as follows.

A fullerene, a derivative thereof, an acridine, a derivative thereof, an eosin derivative, or the like can be used. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structural formulae.

[Chemical Formula 1]

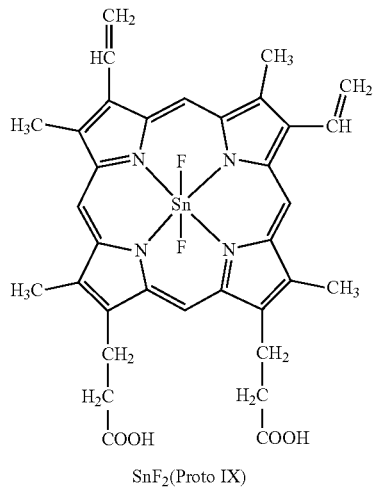

SnF$_2$(Proto IX)

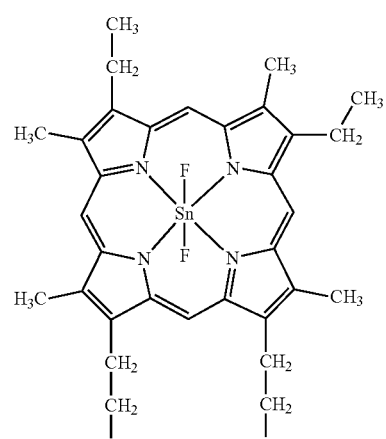

SnF$_2$(Meso IX)

-continued

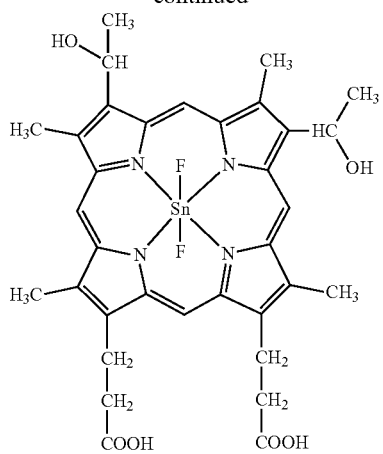

SnF₂(Hemato IX)

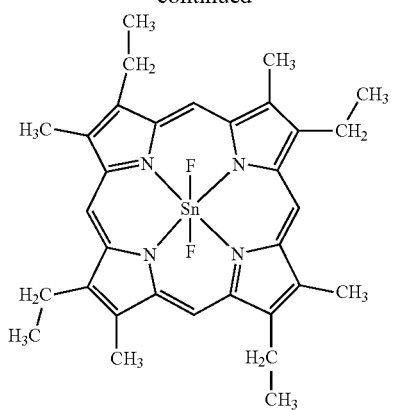

SnF₂(Etio I)

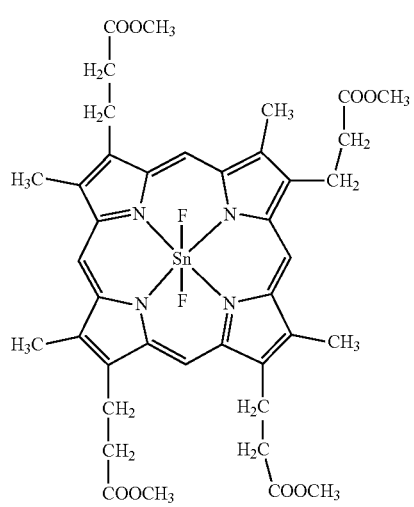

SnF₂(Copro III-4Me)

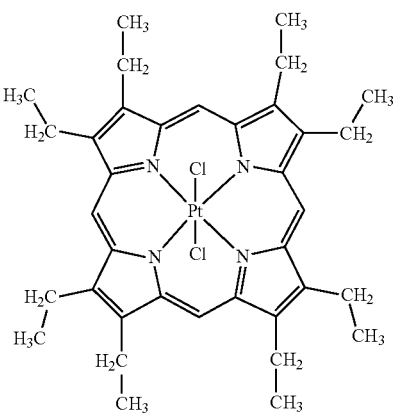

PtCl₂OEP

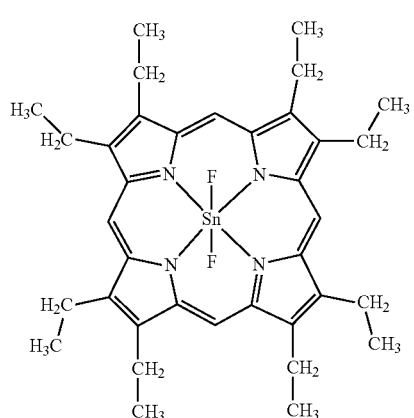

SnF₂(OEP)

In addition, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl] sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), and 9-[3-(4,6-diphenyl-1,3,5-triazin-2-yl)phenyl]-9'-phenyl-2,3'-bi-9H-carbazole (abbreviation: mPCCzPTzn-02), which are represented by the following structural formulae, may be used.

[Chemical Formula 2]
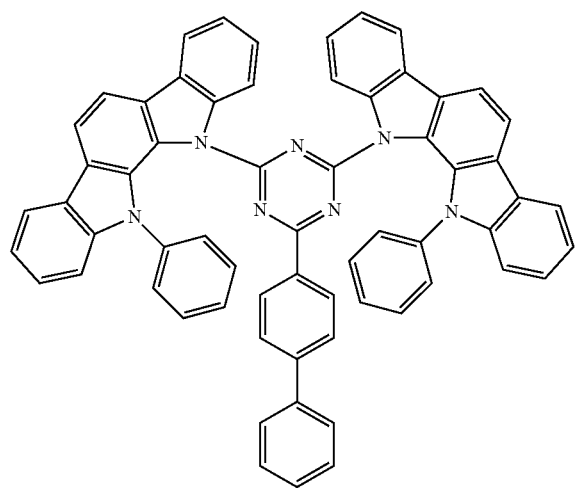
PIC-TRZ
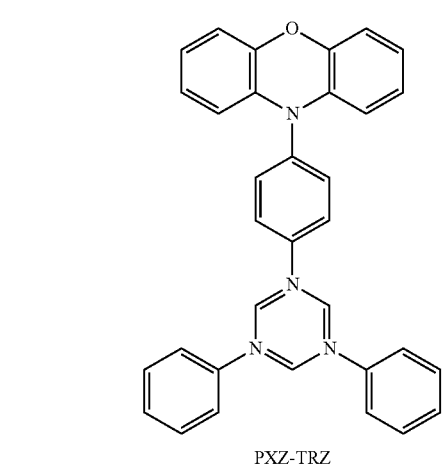
PXZ-TRZ
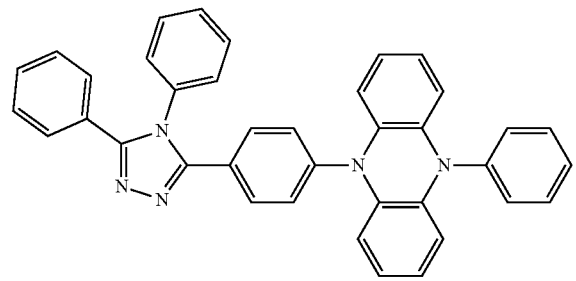
PPZ-3TPT
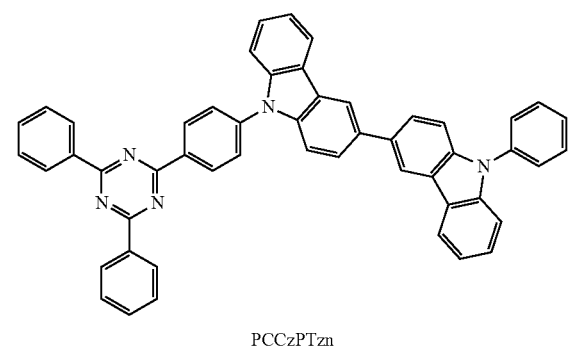
PCCzPTzn
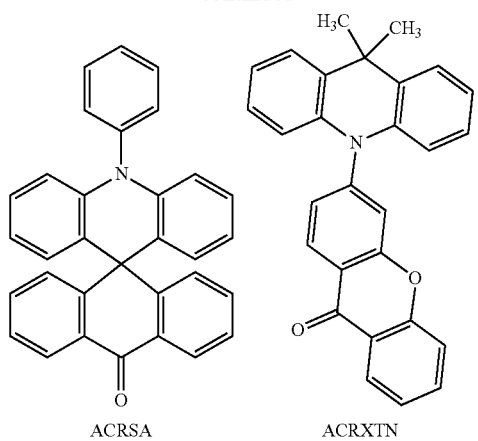
ACRSA    ACRXTN
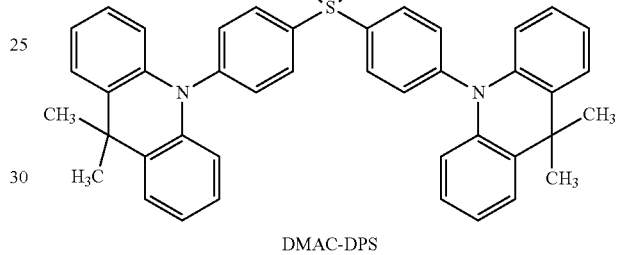
DMAC-DPS
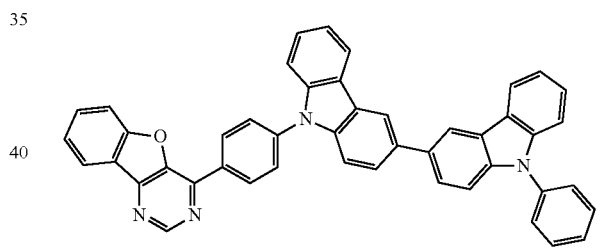
4PCCzPBfpm
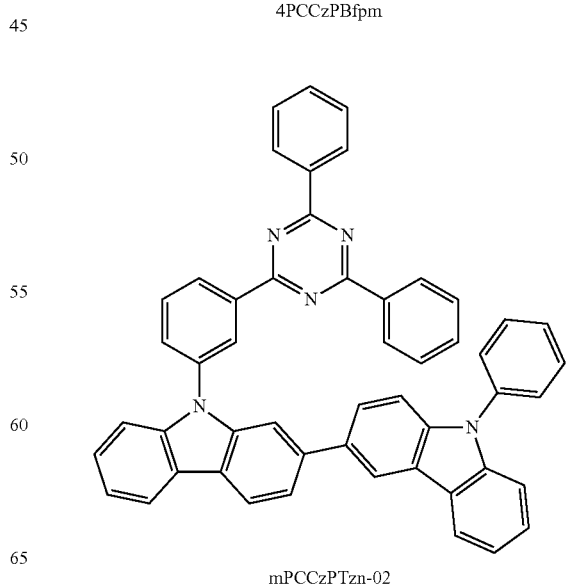
mPCCzPTzn-02

-continued

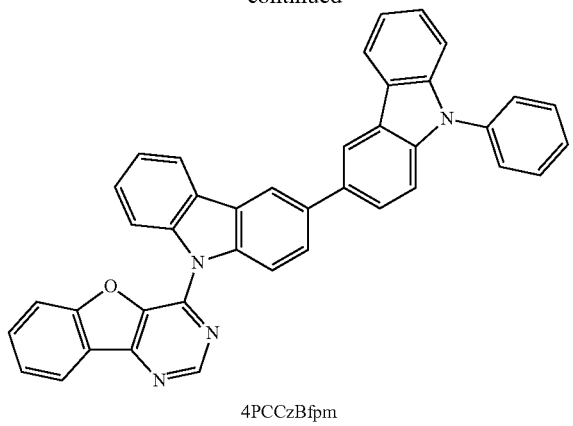

4PCCzBfpm

The heterocyclic compound is preferable because of having both a high electron-transport property and a high hole-transport property owing to a π-electron rich heteroaromatic ring and a π-electron deficient heteroaromatic ring. Among skeletons having a π-electron deficient heteroaromatic ring, a pyridine skeleton, a diazine skeleton (a pyrimidine skeleton, a pyrazine skeleton, and a pyridazine skeleton) and a triazine skeleton are particularly preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor properties and reliability.

Among skeletons having a π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. Note that a dibenzofuran skeleton and a dibenzothiophene skeleton are preferable as the furan skeleton and the thiophene skeleton, respectively. As the pyrrole skeleton, an indole skeleton, a carbazole skeleton, an indolocarbazole skeleton, a bicarbazole skeleton, and a 3-(9-phenyl-9H-carbazol-3-yl)-9H-carb azole skeleton are particularly preferable.

Note that a substance in which a π-electron rich heteroaromatic ring and a π-electron deficient heteroaromatic ring are directly bonded to each other is particularly preferable because the electron-donating property of the π-electron rich heteroaromatic ring and the electron-accepting property of the π-electron deficient heteroaromatic ring are both increased and the energy difference between the $S_1$ level and the $T_1$ level becomes small, and thus thermally activated delayed fluorescence can be obtained efficiently. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

Note that the TADF material is a material that has a small difference between the S1 level and the T1 level and has a function of converting triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. In addition, the triplet excitation energy can be converted into luminescence.

An exciplex whose excited state is formed by two kinds of substances has an extremely small difference between the S1 level and the T1 level and has a function of a TADF material that can convert triplet excitation energy into singlet excitation energy.

Note that a phosphorescent spectrum observed at low temperatures (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between S1 and T1 of the TADF material is preferably smaller than or equal to 0.3 eV, further preferably smaller than or equal to 0.2 eV.

In the case where the TADF material is used as the guest material in the light-emitting layer 113, the S1 level of the host material is preferably higher than the S1 level of the TADF material. In addition, the T1 level of the host material is preferably higher than the T1 level of the TADF material.

As the hole-transport material that can be used as the host material in the light-emitting layer 113, it is preferable to use a substance having a hole mobility higher than or equal to $1 \times 10^{-6}$ cm$^2$/Vs in the case where the square root of the electric field strength [V/cm] is 600. Examples of the substance are shown below.

Examples include compounds having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenyl amine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl] dibenzothiophene (abbreviation: DBTFLP-III), and 4-[4-(9-phenyl-9H-fluoren-9-yl) phenyl]-6-phenyldibenzothiophene (abbreviation: DBTF-LP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl] phenyl}dibenzofuran (abbreviation: mmDBFFLBi-II). Among the above, the compound having an aromatic amine skeleton and the compound having a carbazole skeleton are preferable because these compounds are highly reliable and have high hole-transport properties to contribute to a reduction in driving voltage. In addition, the organic compounds given as examples of the above hole-transport material can also be used.

As the electron-transport material that can be used as the host material in the light-emitting layer 113, it is preferable to use a substance having an electron mobility higher than or equal to $1 \times 10^{-6}$ cm$^2$/Vs in the case where the square root of the electric field strength [V/cm] is 600. Examples of the substance are shown below. In addition, an electron-transport material that can be used in the electron-transport layer 114, which will be described later, can also be used.

Examples include metal complexes such as bis(10-hydroxybenzo[h]quinolinato)beryllium(II) (abbreviation: BeBq$_2$), bis(2-methyl-8-quinolinolato)(4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II), and heterocyclic compounds having a pyridine skeleton, such as 3,5-bis [3-(9H-carbazol-9-yl)phenyl]pyridine (abbreviation: 35DCzPPy) and 1,3,5-tri[3-(3-pyridyl)phenyl]benzene (abbreviation: TmPyPB). Among the above, the heterocyclic compound having a diazine skeleton and the heterocyclic compound having a pyridine skeleton are preferable because of having high reliability. In particular, the heterocyclic compound having a diazine (pyrimidine or pyrazine) skeleton has a high electron-transport property and contributes to a reduction in driving voltage.

In the case where the TADF material is used as the host material in the light-emitting layer 113, the above-described materials can also be used. Note that when the TADF material is used as the host material, triplet excitation energy generated in the TADF material is converted into singlet excitation energy by reverse intersystem crossing and transferred to the emission center substance, whereby the emission efficiency of the light-emitting element can be increased. At this time, the TADF material functions as an energy donor, and the emission center substance functions as an energy acceptor. Therefore, the use of the TADF material as the host material is very effective in the case where a fluorescent substance is used as the guest material. In that case, the S1 level of the TADF material is preferably higher than the S1 level of the fluorescent substance in order to achieve high emission efficiency. Furthermore, the T1 level of the TADF material is preferably higher than the S1 level of the fluorescent substance. Therefore, the T1 level of the TADF material is preferably higher than the T1 level of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In order that singlet excitation energy is efficiently generated from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton that causes light emission) of the fluorescent substance. As the protective group, a substituent having no π bond and saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituent having no π bond has a poor carrier-transport property; thus, the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

In the case where a fluorescent substance is used as the guest material in the light-emitting layer 113, a material having an anthracene skeleton is favorably used as the host material. The use of a substance having an anthracene skeleton makes it possible to obtain a light-emitting layer with high emission efficiency and high durability. Note that as the substance having an anthracene skeleton, a substance having a diphenylanthracene skeleton, in particular, a 9,10-diphenylanthracene skeleton is chemically stable and thus is preferable.

The host material preferably has a carbazole skeleton, in which case the hole-injection and hole-transport properties are improved; further preferably, the host material has a benzocarbazole skeleton where a benzene ring is further condensed to carbazole, in which case the HOMO level thereof is shallower than that in the case of using carbazole by approximately 0.1 eV and thus holes enter the host material easily. In particular, the host material preferably has a dibenzocarbazole skeleton, in which case the HOMO level thereof is shallower than that in the case of using carbazole by approximately 0.1 eV so that holes enter the host material easily, the hole-transport property is improved, and the heat resistance is increased.

Thus, a substance having both of a 9,10-diphenylanthracene skeleton, which is an anthracene skeleton, and a carbazole skeleton (or a benzocarbazole skeleton or a dibenzocarbazole skeleton) is further preferable as the host material. Note that in terms of improving the hole-injection and hole-transport properties described above, a benzofluorene skeleton or a dibenzo fluorene skeleton may be used instead of a carbazole skeleton. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: BH513). In particular, CzPA, cgDBCzPA, 2mBnfPPA, and PCzPA are preferable because they exhibit excellent characteristics.

Note that the host material may be a mixture of a plurality of kinds of substances; in the case of using a mixed host material, it is preferable to mix an electron-transport material and a hole-transport material. By mixing the electron-transport material and the hole-transport material, the transport properties of the light-emitting layer 113 can be easily adjusted and a recombination region can be easily controlled. The weight ratio of the content of the hole-transport material to the content of the electron-transport material is the hole-transport material: the electron-transport material=1:19 to 19:1.

Note that a phosphorescent substance can be used as part of the host material in the case where the host material is formed by mixing a plurality of kinds of substances as described above. When a fluorescent substance is used as the emission center material, a phosphorescent substance can be used as an energy donor for supplying excitation energy to the fluorescent substance.

The materials mixed in the above manner may form an exciplex. When a combination of materials in this case is selected so as to form an exciplex that exhibits light emission whose wavelength overlaps with the wavelength on a lowest-energy-side absorption band of the light-emitting substance, energy can be transferred smoothly and light emission can be obtained efficiently. The use of such a structure is preferred because the driving voltage can be reduced.

Note that at least one of the materials forming an exciplex may be a phosphorescent substance. In this case, triplet excitation energy can be efficiently converted into singlet excitation energy by reverse intersystem crossing.

Note that a combination of materials forming an exciplex is preferably such that the HOMO level of a hole-transport material is higher than or equal to the HOMO level of an electron-transport material. In addition, the LUMO level of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of the mixed film in which the hole-transport material and the electron-transport material are mixed is shifted to the longer wavelength side than the emission spectrum of each of the materials (or has another peak on the longer wavelength side) observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has more long-lifetime components or has a larger proportion of delayed components than that of each of the materials, observed by comparison of transient PL of the hole-transport material, the electron-transport material, and the mixed film of these materials. The transient PL can be rephrased as transient electroluminescence (EL). That is, the formation of an exciplex can also be confirmed by a difference in transient response observed by comparison of the transient EL of the hole-transport material, the material having an electron-transport property, and the mixed film of the materials.

<Electron-Transport Layer>

The electron-transport layer 114 is a layer that transports electrons, which are injected from the second electrode 102, to the light-emitting layer 113 and is provided in contact with the light-emitting layer 113. Note that the electron-transport layer 114 includes an electron-transport material with a HOMO level higher than or equal to −6.0 eV and an organometallic complex of an alkali metal or an alkaline earth metal. The electron mobility of the electron-transport material with a HOMO level higher than or equal to −6.0 eV is preferably higher than or equal to $1\times10^{-7}$ cm$^2$/Vs and lower than or equal to $5\times10^{-5}$ cm$^2$/Vs, further preferably higher than or equal to $1\times10^{-7}$ cm$^2$/Vs and lower than or equal to $1\times10^{-5}$ cm$^2$/Vs in the case where the square root of the electric field strength [V/cm] is 600.

Note that the electron-transport material with a HOMO level higher than or equal to −6.0 eV preferably has an anthracene skeleton, further preferably has an anthracene skeleton and a heterocyclic skeleton. The heterocyclic skeleton is preferably a nitrogen-containing five-membered ring skeleton. The nitrogen-containing five-membered ring skeleton particularly preferably includes two heteroatoms in a ring, like a pyrazol ring, an imidazole ring, an oxazole ring, or, a thiazole ring. In addition, some of the above-described electron-transport materials that can be used as the host material, or the above-described materials given as materials that can be used as the host material in combination with the fluorescent substance can be used in the electron-transport layer 114.

As the organometallic complex of an alkali metal or an alkaline earth metal, an organic complex of lithium is preferable, and 8-hydroxyquinolinato-lithium (abbreviation: Liq) is particularly preferable.

The electron mobility of the electron-transport material with a HOMO level higher than or equal to −6.0 eV that is used for the electron-transport layer 114 (the electron mobility in the case where the square root of the electric field strength [V/cm] is 600) is preferably lower than the electron mobility of the host material used in the light-emitting layer 113. Lowering the electron-transport property of the electron-transport layer enables control of the amount of electrons injected into the light-emitting layer and can prevent the light-emitting layer from having excess electrons.

<Electron-Injection Layer>

The electron-injection layer 115 is a layer for increasing the efficiency of electron injection from the cathode 102 and is preferably formed using a material whose LUMO level value has a small difference (0.5 eV or less) from the work function value of the material of the cathode 102. Thus, the electron-injection layer 115 can be formed using an alkali metal, an alkaline earth metal, or a compound thereof, such as lithium, cesium, lithium fluoride (LiF), cesium fluoride (CsF), calcium fluoride (CaF$_2$), 8-(hydroxyquinolinato) lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate. A rare earth metal compound like erbium fluoride (ErF$_3$) can also be used.

Figure 2B:
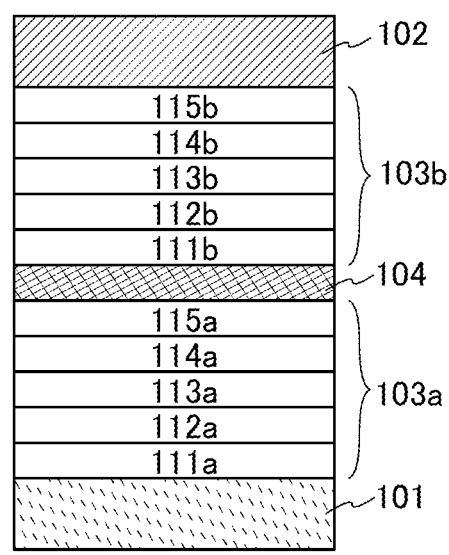

When a charge-generation layer 104 is provided between two EL layers (103a and 103b) as in the light-emitting device illustrated in FIG. 2B, a structure in which a plurality of EL layers are stacked between the pair of electrodes (also referred to as a tandem structure) can be achieved. Note that in this embodiment, functions and materials of the hole-injection layer (111), the hole-transport layer (112), the light-emitting layer (113), the electron-transport layer (114), and the electron-injection layer (115) that are illustrated in FIG. 2A are the same as those of hole-injection layers (111a and 111b), hole-transport layers (112a and 112b), light-emitting layers (113a and 113b), electron-transport layers (114a and 114b), and electron-injection layers (115a and 115b) that are illustrated in FIG. 2B.

<Charge-Generation Layer>

In the light-emitting device of FIG. 2B, the charge-generation layer 104 has a function of injecting electrons into the EL layer 103a closer to the first electrode 101 serving as the anode and injecting holes into the EL layer 103b closer to the second electrode 102 serving as the cathode when a voltage is applied between the first electrode (anode) 101 and the second electrode (cathode) 102. Note that the charge-generation layer 104 may have either a structure in which an electron acceptor (acceptor) is added to a hole-transport material (a P-type layer) or a structure in which an electron donor (donor) is added to an electron-transport material (an N-type layer). Alternatively, both of these structures may be stacked. Alternatively, the P-type layer may be formed in combination with either one or both of an electron-relay layer and an electron-injection buffer layer that will be described later. Note that forming the charge-generation layer 104 with the use of any of the above materials can inhibit the increase in driving voltage that would occur when the EL layers are stacked.

In the case where the charge-generation layer 104 has a structure in which an electron acceptor is added to a hole-transport material (a P-type layer), any of the materials described in this embodiment can be used as the hole-transport material. Examples of the electron acceptor include 7,7,8,8-tetracyano-2,3,5,6-tetrafluoroquinodimethane (abbreviation: F$_4$-TCNQ) and chloranil. Other examples include oxides of metals that belong to Group 4 to Group 8 of the periodic table. Specific examples include vanadium oxide, niobium oxide, tantalum oxide, chromium oxide, molybdenum oxide, tungsten oxide, manganese oxide, and rhenium oxide.

In the case where the charge-generation layer 104 has a structure in which an electron donor is added to an electron-transport material (an N-type layer), any of the materials described in this embodiment can be used as the electron-transport material. As the electron donor, it is possible to use an alkali metal, an alkaline earth metal, a rare earth metal, metals that belong to Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

When the electron-relay layer which is described above as preferably being combined with the P-type layer is provided between the electron-injection buffer layer and the P-type layer, the electron-relay layer has a function of preventing an interaction between the electron-injection buffer layer and the P-type layer and smoothly transferring electrons. The electron-relay layer includes at least an electron-transport material, and the LUMO level of the electron-transport material included in the electron-relay layer is preferably between the LUMO level of the electron-accepting substance in the P-type layer and the LUMO level of a substance included in the electron-injection buffer layer. A specific energy level of the LUMO level of the electron-transport material in the electron-relay layer is preferably higher than or equal to −5.0 eV, further preferably higher than or equal to −5.0 eV and lower than or equal to −3.0 eV. Note that as the electron-transport material in the electron-relay layer, a phthalocyanine-based material or a metal complex having a metal-oxygen bond and an aromatic ligand is preferably used.

A substance having a high electron-injection property, such as an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)), can be used for the electron-injection buffer layer.

In the case where the electron-injection buffer layer contains the electron-transport material and an electron-donating substance, an organic compound such as tetrathianaphthacene (abbreviation: TTN), nickelocene, or decamethylnickelocene, as well as an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)), can be used as the electron-donating substance. As the electron-transport material, a material similar to the above-described material for the electron-transport layer can be used.

Although FIG. 2B illustrates the structure in which two EL layers 103 are stacked, a structure may be employed in which three or more EL layers are stacked with a charge-generation layer provided between different EL layers.

The above-described charge-generation layer can be used instead of the above-described electron-injection layer. In that case, it is preferred that the electron-injection buffer layer, the electron-relay layer, and the P-type layer be stacked in this order from the anode side.

\<Substrate\>

The light-emitting device described in this embodiment can be formed over a variety of substrates. Note that the type of the substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, a laminate film, paper including a fibrous material, and a base material film.

Examples of the glass substrate include barium borosilicate glass, aluminoborosilicate glass, and soda lime glass. Examples of the flexible substrate, the laminate film, and the base material film include plastics typified by polyethylene terephthalate (PET), polyethylene naphthalate (PEN), and polyether sulfone (PES), a synthetic resin such as an acrylic resin, polypropylene, polyester, polyvinyl fluoride, polyvinyl chloride, polyamide, polyimide, an aramid resin, an epoxy resin, an inorganic vapor deposition film, and paper.

For fabrication of the light-emitting device in this embodiment, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers (111, 111a, and 111b), the hole-transport layers (112, 112a, and 112b), the light-emitting layers (113, 113a, 113b, and 113c), the electron-transport layers (114, 114a, and 114b), and the electron-injection layers (115, 115a, and 115b)) included in the EL layers and the charge-generation layers (104, 104a, and 104b) of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, a micro-contact printing method, or a nanoimprinting method), or the like.

Note that materials that can be used for the functional layers (the hole-injection layers (111, 111a, and 111b), the hole-transport layers (112, 112a, and 112b), the light-emitting layers (113, 113a, 113b, and 113c), the electron-transport layers (114, 114a, and 114b), and the electron-injection layers (115, 115a, and 115b)) included in the EL layers (103, 103a, and 103b) and the charge-generation layers (104, 104a, and 104b) of the light-emitting device described in this embodiment are not limited to the above materials, and other materials can also be used in combination as long as the functions of the layers are fulfilled. For example, a high molecular compound (e.g., an oligomer, a dendrimer, and a polymer), a middle molecular compound (a compound between a low molecular compound and a high molecular compound with a molecular weight of 400 to 4000), or an inorganic compound (e.g., a quantum dot material) can be used. As the quantum dot material, a colloidal quantum dot material, an alloyed quantum dot material, a core-shell quantum dot material, a core quantum dot material, or the like can be used.

The light-emitting device of one embodiment of the present invention that has the above-described structure and is used in a light-emitting apparatus can have a long lifetime.

The structure described in this embodiment can be used in an appropriate combination with any of the structures described in the other embodiments.

Embodiment 3

Figure 3A:
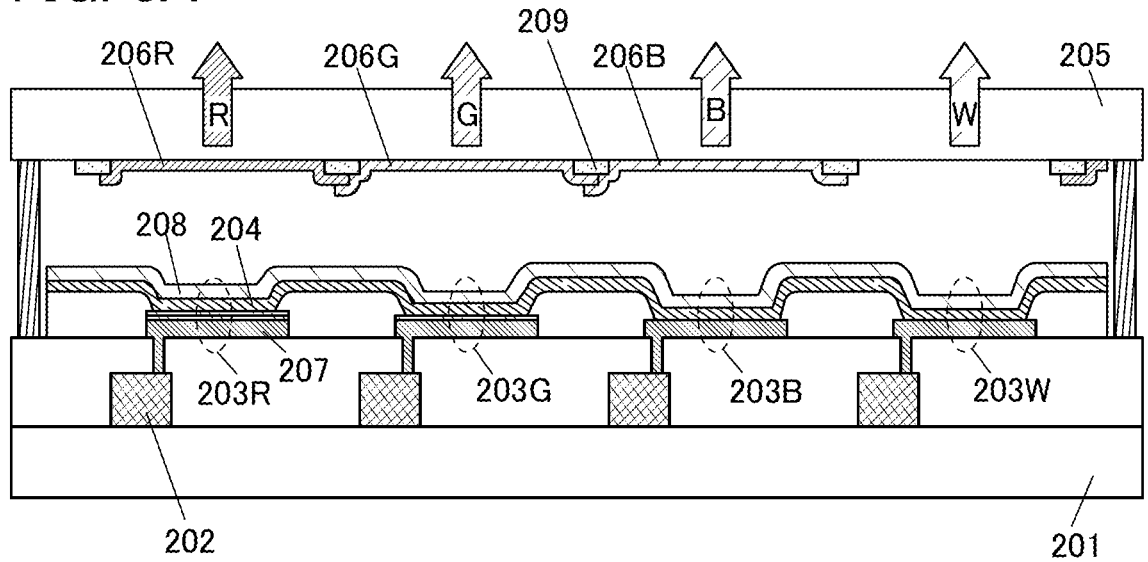
FIG. 3A, FIG. 3B, and FIG. 3C are diagrams illustrating light-emitting apparatuses.

In this embodiment, a light-emitting apparatus of one embodiment of the present invention will be described. A light-emitting apparatus illustrated in FIG. 3A is an active-matrix light-emitting apparatus in which transistors (FETs) 202 over a first substrate 201 are electrically connected to light-emitting devices (203R, 203G, 203B, and 203W); the light-emitting devices (203R, 203G, 203B, and 203W) include a common EL layer 204 and each have a microcavity structure where the optical path length between electrodes of each light-emitting device is adjusted according to the emission color of the light-emitting device. The light-emitting apparatus is a top-emission light-emitting apparatus in which light obtained from the EL layer 204 is emitted through color filters (206R, 206G, and 206B) formed on a second substrate 205.

In the light-emitting apparatus illustrated in FIG. 3A, a first electrode 207 is formed so as to function as a reflective electrode. A second electrode 208 is formed to function as a transflective electrode having both properties of transmitting and reflecting light (visible light or near-infrared light). Note that the description in the other embodiments can be referred to for electrode materials forming the first electrode 207 and the second electrode 208, and appropriate materials can be used.

Figure 3B:
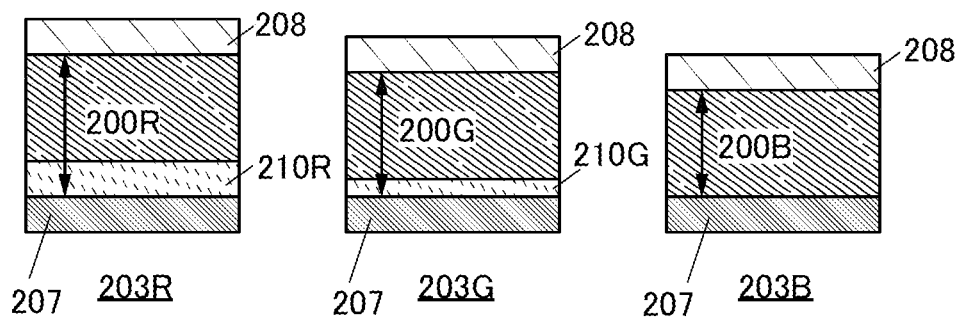

In the case where the light-emitting device 203R is a red-light-emitting device, the light-emitting device 203G is a green-light-emitting device, the light-emitting device 203B is a blue-light-emitting device, and the light-emitting device 203W is a white-light-emitting device in FIG. 3A, for example, the distance between the first electrode 207 and the second electrode 208 in the light-emitting device 203R is adjusted to have an optical path length 200R, the distance between the first electrode 207 and the second electrode 208 in the light-emitting device 203G is adjusted to have an optical path length 200G, and the distance between the first electrode 207 and the second electrode 208 in the light-emitting device 203B is adjusted to have an optical path length 200B, as illustrated in FIG. 3B. Note that optical adjustment can be performed in such a manner that a conductive layer 210R is stacked over the first electrode 207 in the light-emitting device 203R and a conductive layer 210G is stacked in the light-emitting device 203G as illustrated in FIG. 3B.

The color filters (206R, 206G, and 206B) are formed on the second substrate 205. Note that the color filter is a filter that transmits visible light in a specific wavelength range and blocks visible light in a specific wavelength range. Thus, as illustrated in FIG. 3A, the color filter 206R that transmits only light in the red wavelength range is provided in a position overlapping with the light-emitting device 203R, whereby red light emission can be obtained from the light-emitting device 203R. The color filter 206G that transmits only light in the green wavelength range is provided in a position overlapping with the light-emitting device 203G, whereby green light emission can be obtained from the light-emitting device 203G. The color filter 206B that transmits only light in the blue wavelength range is provided in a position overlapping with the light-emitting device 203B, whereby blue light emission can be obtained from the light-emitting device 203B. The light-emitting device 203W can emit white light without a color filter. Note that a black layer (black matrix) 209 may be provided at an end portion of one type of color filter. The color filters (206R, 206G, and 206B) and the black layer 209 may be covered with an overcoat layer using a transparent material.

Figure 3C:
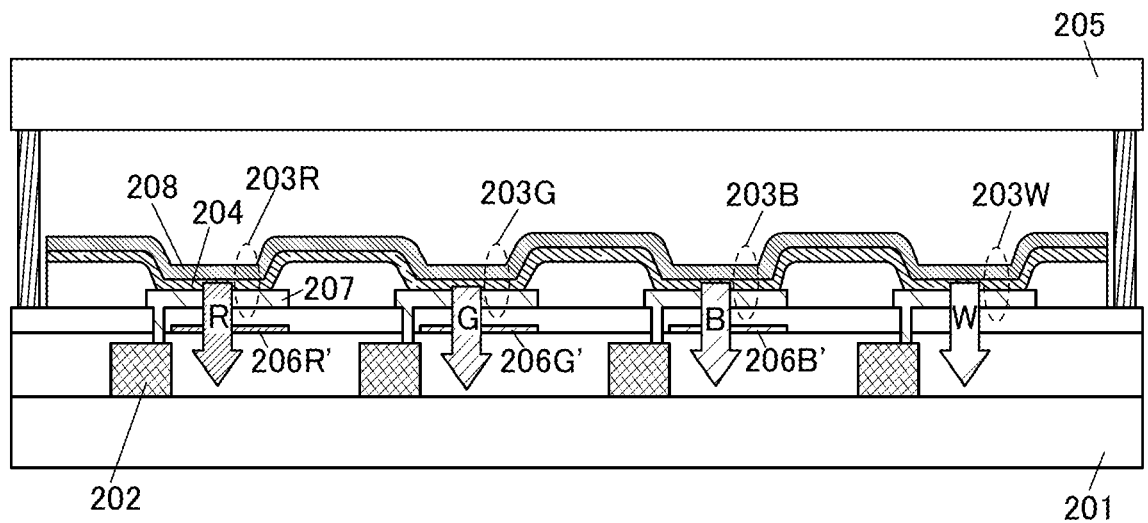

Although the light-emitting apparatus in FIG. 3A has a structure in which light is extracted from the second substrate 205 side (a top-emission structure), the light-emitting apparatus may have a structure in which light is extracted from the first substrate 201 side where the FETs 202 are formed (a bottom-emission structure) as illustrated in FIG. 3C. For a bottom-emission light-emitting apparatus, the first electrode 207 is formed so as to function as a transflective electrode and the second electrode 208 is formed so as to function as a reflective electrode. As the first substrate 201, a substrate having at least a light-transmitting property is used. Color filters (206R', 206G', and 206B') are provided closer to the first substrate 201 than the light-emitting devices (203R, 203G, and 203B) are, as illustrated in FIG. 3C.

FIG. 3A shows the case where the light-emitting devices are the red-light-emitting device, the green-light-emitting device, the blue-light-emitting device, and the white-light-emitting device; however, the light-emitting devices of embodiments of the present invention are not limited to the above structures, and a yellow-light-emitting device or an orange-light-emitting device may be included. Note that the description in the other embodiments can be referred to for materials that are used for the EL layers (a light-emitting layer, a hole-injection layer, a hole-transport layer, an electron-transport layer, an electron-injection layer, a charge-generation layer, and the like) to fabricate each of the light-emitting devices, and appropriate materials can be used. In that case, a color filter needs to be appropriately selected according to the emission color of the light-emitting device.

With the above structure, a light-emitting apparatus including light-emitting devices that exhibit a plurality of emission colors can be obtained.

Note that the structure described in this embodiment can be used in an appropriate combination with any of the structures described in the other embodiments.

Embodiment 4

In this embodiment, a light-emitting apparatus of one embodiment of the present invention will be described.

The use of the device structure of the light-emitting device of one embodiment of the present invention allows fabrication of an active-matrix light-emitting apparatus and a passive-matrix light-emitting apparatus. Note that an active-matrix light-emitting apparatus has a structure including a combination of a light-emitting device and a transistor (an FET). Thus, each of a passive-matrix light-emitting apparatus and an active-matrix light-emitting apparatus is included in one embodiment of the present invention. Note that any of the light-emitting devices described in the other embodiments can be used in the light-emitting apparatus described in this embodiment.

In this embodiment, an active-matrix light-emitting apparatus will be described with reference to FIG. 4.

Figure 4A:
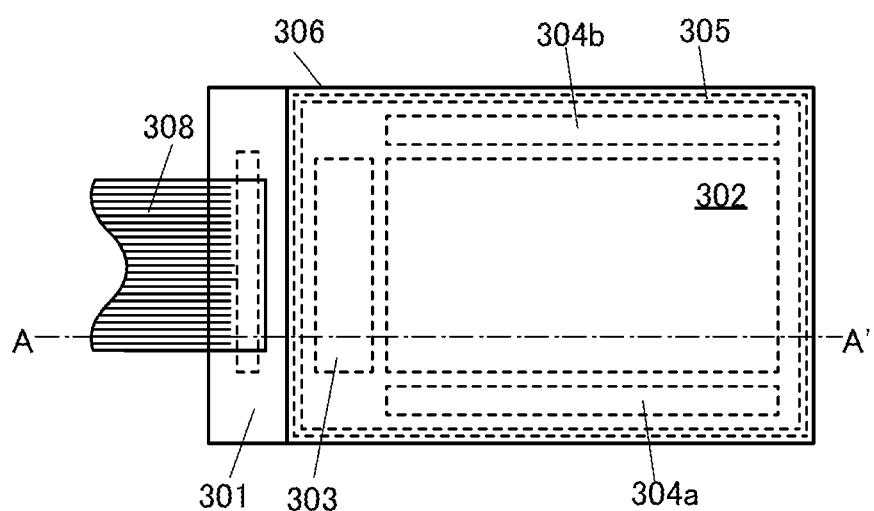
FIG. 4A is a top view illustrating a light-emitting apparatus.
Figure 4B:
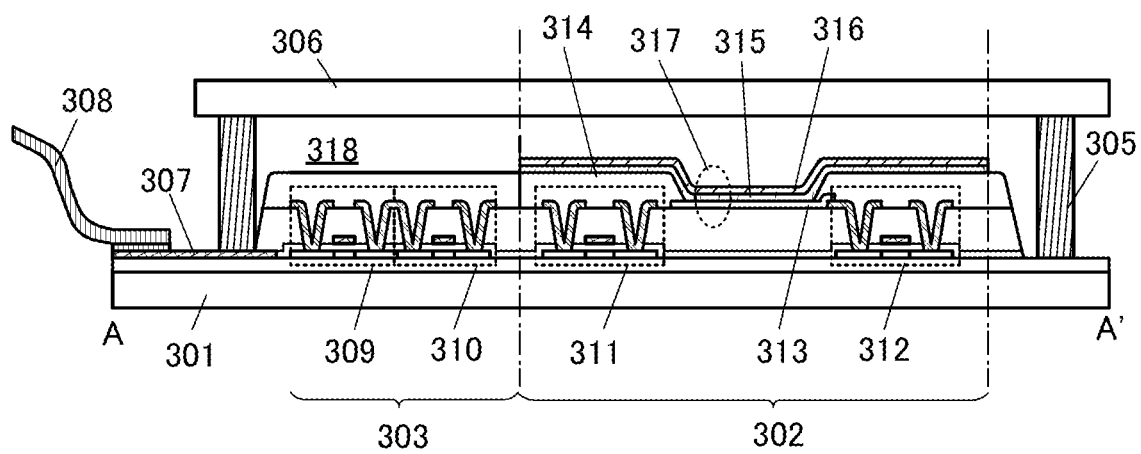
FIG. 4B is a cross-sectional view illustrating the light-emitting apparatus.

FIG. 4A is a top view showing a light-emitting apparatus, and FIG. 4B is a cross-sectional view taken along a chain line A-A' in FIG. 4A. The active-matrix light-emitting apparatus includes a pixel portion 302, a driver circuit portion (source line driver circuit) 303, and driver circuit portions (gate line driver circuits) (304a and 304b) that are provided over a first substrate 301. The pixel portion 302 and the driver circuit portions (303, 304a, and 304b) are sealed between the first substrate 301 and a second substrate 306 with a sealant 305.

A lead wiring 307 is provided over the first substrate 301. The lead wiring 307 is electrically connected to an FPC 308 that is an external input terminal. The FPC 308 transmits a signal (e.g., a video signal, a clock signal, a start signal, and a reset signal) and a potential from the outside to the driver circuit portions (303, 304a, and 304b). The FPC 308 may be provided with a printed wiring board (PWB). Note that the light-emitting apparatus provided with an FPC or a PWB is included in the category of a light-emitting apparatus.

Next, FIG. 4B illustrates the cross-sectional structure.

The pixel portion 302 is made up of a plurality of pixels each including an FET (switching FET) 311, an FET (current control FET) 312, and a first electrode 313 electrically connected to the FET 312. Note that the number of FETs included in each pixel is not particularly limited and can be set appropriately as needed.

As FETs 309, 310, 311, and 312, for example, a staggered transistor or an inverted staggered transistor can be used without particular limitation. A top-gate transistor, a bottom-gate transistor, or the like may be used.

Note that there is no particular limitation on the crystallinity of a semiconductor that can be used for the FETs 309, 310, 311, and 312, and an amorphous semiconductor or a semiconductor having crystallinity (a microcrystalline semiconductor, a polycrystalline semiconductor, a single crystal semiconductor, or a semiconductor partly including crystal regions) may be used. The use of a semiconductor having crystallinity is preferable, in which case deterioration of the transistor characteristics can be inhibited.

For the semiconductor, a Group 14 element, a compound semiconductor, an oxide semiconductor, an organic semiconductor, or the like can be used, for example. Typically, a semiconductor containing silicon, a semiconductor containing gallium arsenide, an oxide semiconductor containing indium, or the like can be used.

The driver circuit portion 303 includes the FET 309 and the FET 310. The driver circuit portion 303 may be formed with a circuit including transistors having the same conductivity type (either only n-channel transistors or only p-channel transistors) or a CMOS circuit including an n-channel transistor and a p-channel transistor. Furthermore, a driver circuit may be provided outside.

An end portion of the first electrode 313 is covered with an insulator 314. For the insulator 314, an organic compound such as a negative photosensitive resin or a positive photosensitive resin (an acrylic resin), or an inorganic compound such as silicon oxide, silicon oxynitride, or silicon nitride can be used. An upper end portion or a lower end portion of the insulator 314 preferably has a curved surface with curvature. In that case, favorable coverage with a film formed over the insulator 314 can be obtained.

An EL layer 315 and a second electrode 316 are stacked over the first electrode 313. The EL layer 315 includes a light-emitting layer, a hole-injection layer, a hole-transport layer, an electron-transport layer, an electron-injection layer, a charge-generation layer, and the like.

The structure and materials described in the other embodiments can be used for the structure of a light-emitting device 317 described in this embodiment. Although not shown here, the second electrode 316 is electrically connected to the FPC 308 that is an external input terminal.

Although the cross-sectional view in FIG. 4B shows only one light-emitting device 317, a plurality of light-emitting devices are arranged in a matrix in the pixel portion 302. Light-emitting devices from which light of three kinds of colors (R, G, and B) is obtained are selectively formed in the pixel portion 302, whereby a light-emitting apparatus capable of full-color display can be formed. In addition to the light-emitting devices from which light of three kinds of colors (R, G, and B) is obtained, for example, light-emitting devices from which light of white (W), yellow (Y), magenta (M), cyan (C), and the like is obtained may be formed. For example, when the light-emitting devices from which light of some of the above colors is obtained are added to the light-emitting devices from which light of three kinds of colors (R, G, and B) is obtained, effects such as an improvement in color purity and a reduction in power consumption can be obtained. Alternatively, a light-emitting apparatus that is capable of full-color display may be fabricated by a combination with color filters. As the kinds of color filters, red (R), green (G), blue (B), cyan (C), magenta (M), and yellow (Y) color filters and the like can be used.

When the second substrate 306 and the first substrate 301 are bonded to each other with the sealant 305, the FETs (309, 310, 311, and 312) and the light-emitting device 317 over the first substrate 301 are provided in a space 318 surrounded by the first substrate 301, the second substrate 306, and the sealant 305. Note that the space 318 may be filled with an inert gas (e.g., nitrogen or argon) or an organic substance (including the sealant 305).

An epoxy resin or glass frit can be used for the sealant 305. A material that transmits moisture and oxygen as little as possible is preferably used for the sealant 305. As the second substrate 306, a substrate that can be used as the first substrate 301 can be similarly used. Thus, any of the various substrates described in the other embodiments can be appropriately used. As the substrate, a glass substrate, a quartz substrate, or a plastic substrate made of FRP (Fiber-Reinforced Plastics), PVF (polyvinyl fluoride), polyester, an acrylic resin, or the like can be used. In the case where glass frit is used for the sealant, the first substrate 301 and the second substrate 306 are preferably glass substrates in terms of adhesion.

In the above manner, the active-matrix light-emitting apparatus can be obtained.

In the case where the active-matrix light-emitting apparatus is formed over a flexible substrate, the FETs and the light-emitting device may be directly formed over the flexible substrate; alternatively, the FETs and the light-emitting device may be formed over a substrate provided with a separation layer and then separated at the separation layer by application of heat, force, laser irradiation, or the like to be transferred to a flexible substrate. For the separation layer, a stack of inorganic films such as a tungsten film and a silicon oxide film, or an organic resin film of polyimide or the like can be used, for example. Examples of the flexible substrate include, in addition to a substrate where a transistor can be formed, a paper substrate, a cellophane substrate, an aramid film substrate, a polyimide film substrate, a cloth substrate (including a natural fiber (silk, cotton, and hemp), a synthetic fiber (nylon, polyurethane, and polyester), a regenerated fiber (acetate, cupro, rayon, and regenerated polyester), and the like), a leather substrate, and a rubber substrate. With the use of any of these substrates, high durability, high heat resistance, a reduction in weight, and a reduction in thickness can be achieved.

The light-emitting device included in the active-matrix light-emitting apparatus may be driven to emit light in a pulsed manner (using a frequency of kHz or MHz, for example) so that the light is used for display. The light-emitting device formed using any of the above organic compounds has excellent frequency characteristics; thus, the time for driving the light-emitting device can be shortened, and the power consumption can be reduced. Furthermore, a reduction in driving time leads to inhibition of heat generation, so that the degree of deterioration of the light-emitting device can be reduced.

Note that the structure described in this embodiment can be used in an appropriate combination with any of the structures described in the other embodiments.

Embodiment 5

In this embodiment, examples of a variety of electronic devices and an automobile completed using the light-emitting device of one embodiment of the present invention or a light-emitting apparatus including the light-emitting device of one embodiment of the present invention will be described. Note that the light-emitting apparatus can be used mainly in a display portion of the electronic device described in this embodiment.

Electronic devices illustrated in FIG. 5A to FIG. 5E can include a housing 7000, a display portion 7001, a speaker 7003, an LED lamp 7004, an operation key 7005 (including a power switch or an operation switch), a connection terminal 7006, a sensor 7007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 7008, and the like.

Figure 5A:
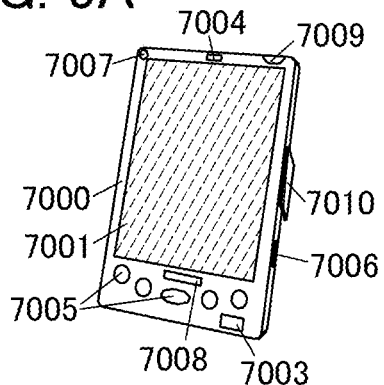
FIG. 5A is a diagram illustrating a mobile computer.

FIG. 5A illustrates a mobile computer that can include a switch 7009, an infrared port 7010, and the like in addition to the above components.

Figure 5B:
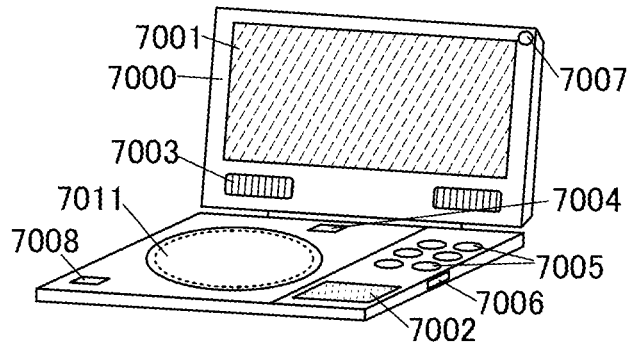
FIG. 5B is a diagram illustrating a portable image reproducing device.

FIG. 5B illustrates a portable image reproducing device (e.g., a DVD player) that is provided with a recording medium and can include a second display portion 7002, a recording medium reading portion 7011, and the like in addition to the above components.

Figure 5C:
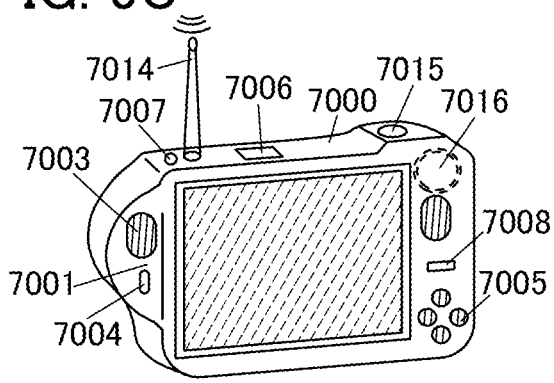
FIG. 5C is a diagram illustrating a digital camera.

FIG. 5C illustrates a digital camera that has a television reception function and can include an antenna 7014, a shutter button 7015, an image receiving portion 7016, and the like in addition to the above components.

Figure 5D:
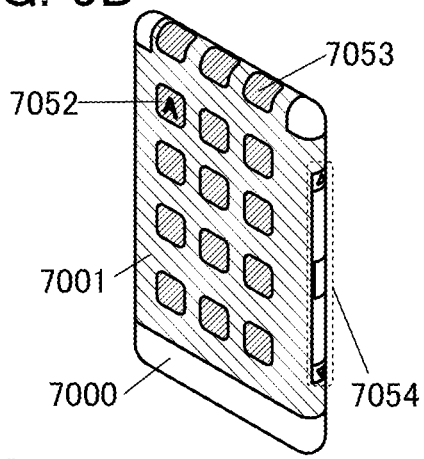
FIG. 5D is a diagram illustrating a portable information terminal.

FIG. 5D illustrates a portable information terminal. The portable information terminal has a function of displaying information on three or more surfaces of the display portion 7001. Here, an example in which information 7052, information 7053, and information 7054 are displayed on different surfaces is shown. For example, the user can check the information 7053 displayed in a position that can be observed from above the portable information terminal, with the portable information terminal put in a breast pocket of his/her clothes. The user can see the display without taking out the portable information terminal from the pocket and decide whether to answer the call, for example.

Figure 5E:
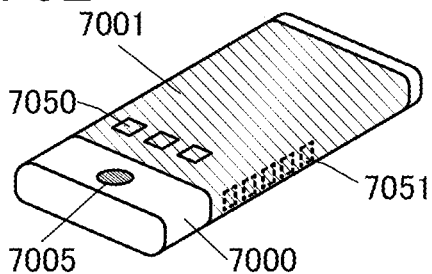
FIG. 5E is a diagram illustrating a portable information terminal.

FIG. 5E illustrates a portable information terminal (e.g., a smartphone) that can include the display portion 7001, the operation key 7005, and the like in the housing 7000. Note that the speaker 7003, the connection terminal 7006, the sensor 7007, or the like may be provided in the portable information terminal. The portable information terminal can display text and image information on its plurality of surfaces. Here, an example in which three icons 7050 are displayed is shown. Information 7051 indicated by dashed rectangles can be displayed on another surface of the display portion 7001. Examples of the information 7051 include notification of reception of an e-mail, SNS, or an incoming call, the title and sender of an e-mail, SNS, or the like, the date, the time, remaining battery, and the reception strength of an antenna. Alternatively, the icon 7050 or the like may be displayed in the position where the information 7051 is displayed.

Figure 5F:
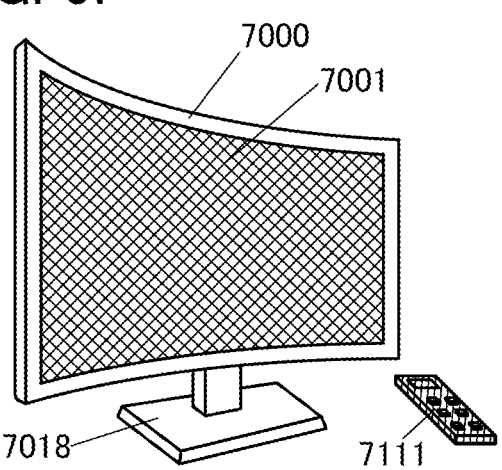
FIG. 5F is a diagram illustrating a television device.

FIG. 5F illustrates a large-size television set (also referred to as TV or television receiver) that can include the housing 7000, the display portion 7001, and the like. Here, a structure in which the housing 7000 is supported by a stand 7018 is shown. The television set can be operated with a separate remote controller 7111 or the like. Note that the display portion 7001 may include a touch sensor, in which case the television set may be operated by touch on the display portion 7001 with a finger or the like. The remote controller 7111 may include a display portion for displaying information output from the remote controller 7111. With operation keys or a touch panel provided in the remote controller 7111, channels and volume can be controlled and images displayed on the display portion 7001 can be controlled.

The electronic devices shown in FIG. 5A to FIG. 5F can have a variety of functions. For example, they can have a function of displaying a variety of information (e.g., a still image, a moving image, and a text image) on the display portion, a touch panel function, a function of displaying a calendar, date, time, or the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image information mainly on one display portion while displaying text information mainly on another display portion, a function of displaying a three-dimensional image by displaying images on a plurality of display portions with a parallax taken into account, or the like. The electronic device including an image receiving portion can have a function of taking a still image, a function of taking a moving image, a function of automatically or manually correcting a taken image, a function of storing a taken image in a recording medium (an external recording medium or a recording medium incorporated in the camera), a function of displaying a taken image on the display portion, and the like. Note that functions that the electronic devices shown in FIG. 5A to FIG. 5F can have are not limited to those, and the electronic devices can have a variety of functions.

Figure 5G:
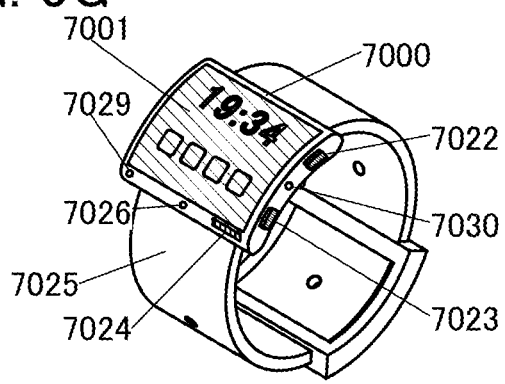
FIG. 5G is a diagram illustrating a portable information terminal.

FIG. 5G illustrates a watch-type portable information terminal that can be used as a smart watch, for example. The watch-type portable information terminal includes the housing 7000, the display portion 7001, operation buttons 7022 and 7023, a connection terminal 7024, a band 7025, a microphone 7026, a sensor 7029, a speaker 7030, and the like. The display surface of the display portion 7001 is bent, and display can be performed along the bent display surface. The portable information terminal enables hands-free calling by mutually communicating with, for example, a headset capable of wireless communication. With the connection terminal 7024, the portable information terminal can perform mutual data transmission with another information terminal and be charged. Wireless power feeding can also be employed for the charging operation.

The display portion 7001 mounted in the housing 7000 also serving as a bezel includes a non-rectangular display region. The display portion 7001 can display an icon indicating time, another icon, and the like. The display portion 7001 may be a touch panel (an input/output device) including a touch sensor (an input device).

Note that the smart watch shown in FIG. 5G can have a variety of functions. For example, it can have a function of displaying a variety of information (e.g., a still image, a moving image, and a text image) on the display portion, a touch panel function, a function of displaying a calendar, date, time, or the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

Moreover, a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like can be included inside the housing 7000.

Note that the light-emitting apparatus of one embodiment of the present invention can be used in the display portions of the electronic devices described in this embodiment, enabling the electronic devices to have a long lifetime.

Figure 6A:
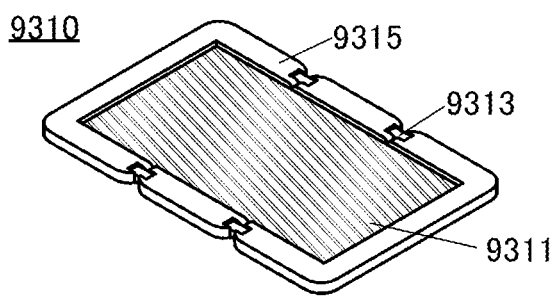
FIG. 6A, FIG. 6B, and FIG. 6C are diagrams illustrating an electronic device.
Figure 6B:
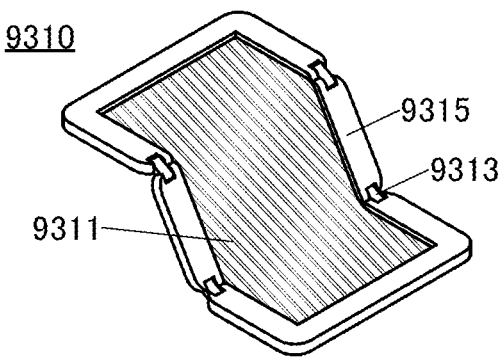
Figure 6C:
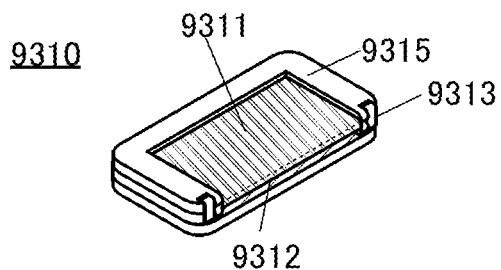

Another electronic device including the light-emitting apparatus is a foldable portable information terminal shown in FIG. 6A to FIG. 6C. FIG. 6A illustrates a portable information terminal 9310 that is opened. FIG. 6B illustrates the portable information terminal 9310 in a state in the middle of change from one of an opened state and a folded state to the other. FIG. 6C illustrates the portable information terminal 9310 that is folded. The portable information terminal 9310 is excellent in portability when folded, and is excellent in display browsability when opened because of a seamless large display region.

A display portion 9311 is supported by three housings 9315 joined together by hinges 9313. Note that the display portion 9311 may be a touch panel (an input/output device) including a touch sensor (an input device). By bending the display portion 9311 at a portion between two housings 9315 with the use of the hinges 9313, the portable information terminal 9310 can be reversibly changed in shape from an opened state to a folded state. The light-emitting apparatus of one embodiment of the present invention can be used in the display portion 9311. An electronic device having a long lifetime can be provided. A display region 9312 in the display portion 9311 is a display region that is positioned at a side surface of the portable information terminal 9310 that is folded. On the display region 9312, information icons, file shortcuts of frequently used applications and programs, and the like can be displayed; hence, confirmation of information and start of an application can be smoothly performed.

Figure 7A:
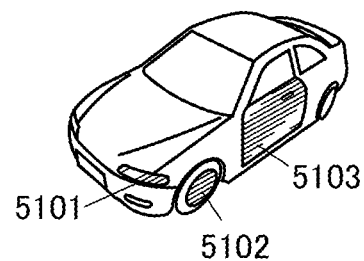
FIG. 7A and FIG. 7B are diagrams illustrating an automobile.
Figure 7B:
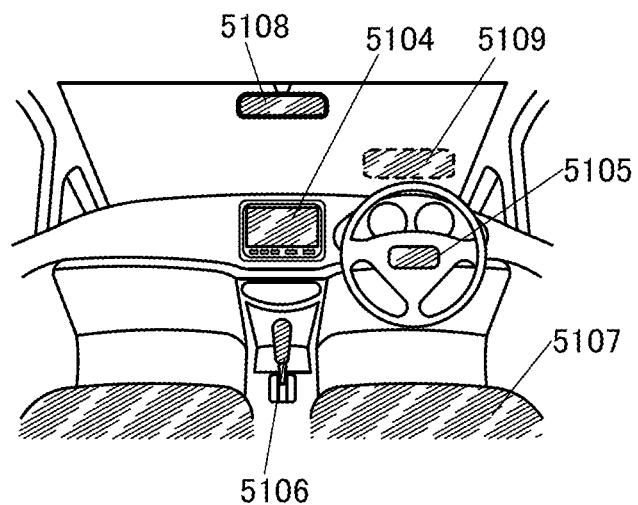

FIG. 7A and FIG. 7B show an automobile including the light-emitting apparatus. In other words, the light-emitting apparatus can be integrated into an automobile. Specifically, the light-emitting apparatus can be applied to lights 5101 (including lights of the rear part of the car), a wheel 5102, a part or the whole of a door 5103, or the like on the outer side of the automobile illustrated in FIG. 7A. The light-emitting apparatus can also be applied to a display portion 5104, a steering wheel 5105, a shifter 5106, a seat 5107, an inner rearview mirror 5108, a windshield 5109, or the like on the inner side of the automobile illustrated in FIG. 7B. The light-emitting apparatus may be applied to part of any of the other glass windows.

In the above manner, the electronic devices and the automobile each including the light-emitting apparatus of one embodiment of the present invention can be obtained. In that case, a long-lifetime electronic device can be obtained. In addition, the light-emitting apparatus can be used for electronic devices and automobiles in a variety of fields without being limited to those described in this embodiment.

Note that the structure described in this embodiment can be used in an appropriate combination with any of the structures described in the other embodiments.

Embodiment 6

In this embodiment, a structure of a lighting device fabricated using the light-emitting apparatus of one embodiment of the present invention or the light-emitting device which is part of the light-emitting apparatus will be described with reference to FIG. 8.

Figure 8A:
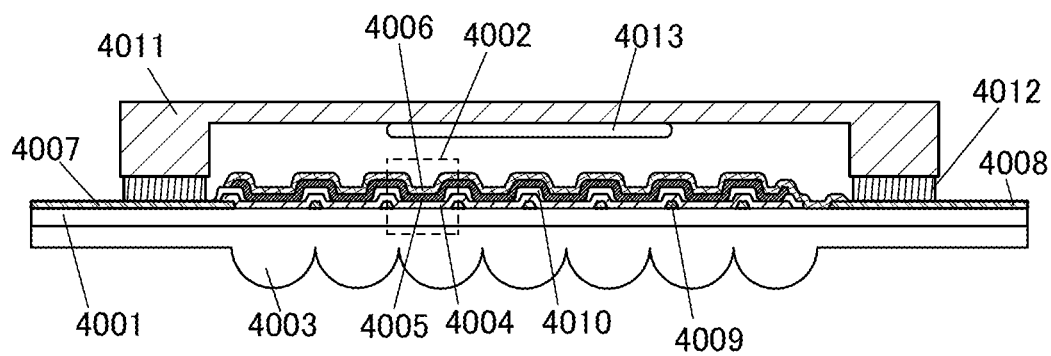
FIG. 8A and FIG. 8B are diagrams illustrating lighting devices.
Figure 8B:
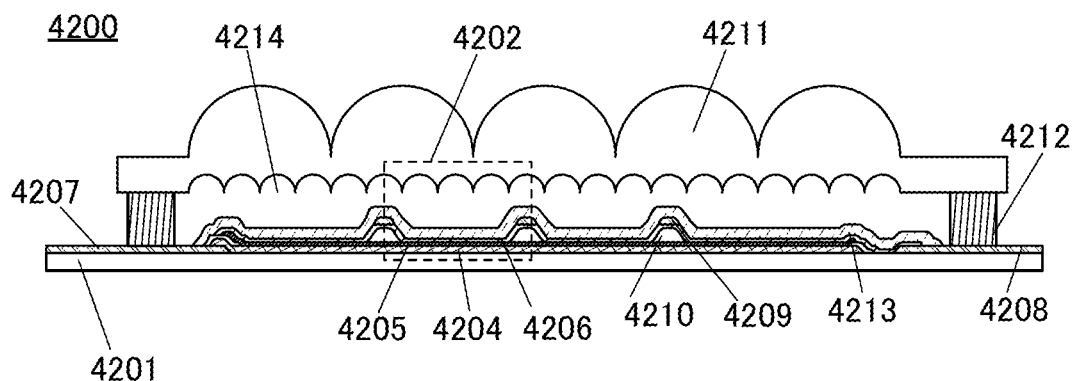

FIG. 8A and FIG. 8B show examples of cross-sectional views of lighting devices. FIG. 8A illustrates a bottom-emission lighting device in which light is extracted from the substrate side, and FIG. 8B illustrates a top-emission lighting device in which light is extracted from the sealing substrate side.

A lighting device 4000 shown in FIG. 8A includes a light-emitting device 4002 over a substrate 4001. In addition, the lighting device 4000 includes a substrate 4003 with unevenness on the outer side of the substrate 4001. The light-emitting device 4002 includes a first electrode 4004, an EL layer 4005, and a second electrode 4006.

The first electrode 4004 is electrically connected to an electrode 4007, and the second electrode 4006 is electrically connected to an electrode 4008. An auxiliary wiring 4009 electrically connected to the first electrode 4004 may be provided. An insulating layer 4010 is formed over the auxiliary wiring 4009.

The substrate 4001 and a sealing substrate 4011 are bonded to each other with a sealant 4012. A desiccant 4013 is preferably provided between the sealing substrate 4011 and the light-emitting device 4002. Since the substrate 4003 has the unevenness shown in FIG. 8A, the extraction efficiency of light generated in the light-emitting device 4002 can be increased.

A lighting device 4200 in FIG. 8B includes a light-emitting device 4202 over a substrate 4201. The light-emitting device 4202 includes a first electrode 4204, an EL layer 4205, and a second electrode 4206.

The first electrode 4204 is electrically connected to an electrode 4207, and the second electrode 4206 is electrically connected to an electrode 4208. An auxiliary wiring 4209 electrically connected to the second electrode 4206 may be provided. An insulating layer 4210 may be provided under the auxiliary wiring 4209.

The substrate 4201 and a sealing substrate 4211 with unevenness are bonded to each other with a sealant 4212. A barrier film 4213 and a planarization film 4214 may be provided between the sealing substrate 4211 and the light-emitting device 4202. Since the sealing substrate 4211 has the unevenness shown in FIG. 8B, the extraction efficiency of light generated in the light-emitting device 4202 can be increased.

Application examples of such lighting devices include ceiling lights for indoor lighting. Examples of the ceiling lights include a ceiling direct mount light and a ceiling embedded light. Such a lighting device is fabricated using the light-emitting apparatus and a housing or a cover in combination.

As another example, such lighting devices can be used for a foot light that illuminates a floor so that safety on the floor can be improved. The foot light can be effectively used in a bedroom, on a staircase, or on a passage, for example. In such a case, the size and shape of the foot light can be changed depending on the area or structure of a room. The foot light can also be a stationary lighting device fabricated using the light-emitting apparatus and a support base in combination.

Such lighting devices can also be used for a sheet-like lighting device (sheet-like lighting). The sheet-like lighting, which is attached to a wall when used, is space-saving and thus can be used for a wide variety of applications. The area of the sheet-like lighting can be easily increased. The sheet-like lighting can also be used on a wall and a housing that have a curved surface.

Besides the above examples, the light-emitting apparatus of one embodiment of the present invention or the light-emitting device which is a part of the light-emitting apparatus can be used as part of furniture in a room, whereby a lighting device that has a function of the furniture can be obtained.

As described above, a variety of lighting devices that include the light-emitting apparatus can be obtained. Note that these lighting devices are also embodiments of the present invention.

The structures described in this embodiment can be used in an appropriate combination with any of the structures described in the other embodiments.

<Reference Example>

In this reference example, methods for calculating the HOMO levels, the LUMO levels, and the electron mobilities of the organic compounds used in the embodiments will be described.

The HOMO level and the LUMO level can be calculated through cyclic voltammetry (CV) measurement.

An electrochemical analyzer (model number: ALS model 600A or 600C, manufactured by BAS Inc.) was used as a measurement apparatus. To prepare a solution for the CV measurement, dehydrated dimethylformamide (DMF) (manufactured by Sigma-Aldrich Inc., 99.8%, catalog No. 22705-6) was used as a solvent, tetra-n-butylammonium perchlorate (n-Bu4NClO4) (manufactured by Tokyo Chemical Industry Co., Ltd., catalog No. T0836) as a supporting electrolyte was dissolved at a concentration of 100 mmol/L, and the object to be measured was dissolved at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag+ electrode (RE7 reference electrode for non-aqueous solvent, manufactured by BAS Inc.) was used as a reference electrode. Note that the measurement was conducted at room temperature (20 to 25° C.). The scan speed in the CV measurement was fixed to 0.1 V/sec, and an oxidation potential Ea [V] and a reduction potential Ec [V] with respect to the reference electrode were measured. Ea is an intermediate potential of an oxidation-reduction wave, and Ec is an intermediate potential of a reduction-oxidation wave. Here, since the potential energy of the reference electrode used in this reference example with respect to the vacuum level is known to be −4.94 [eV], the HOMO level and the LUMO level can be calculated by the following formulae: HOMO level [eV]=−4.94−Ea and LUMO level [eV]=−4.94−Ec.

The electron mobility can be measured by an impedance spectroscopy method (IS method).

As a method for measuring the carrier mobility of an EL material, a time-of-flight method (TOF method), a method (SCLC method) using I-V characteristics of a space-charge-limited current (SCLC), or the like has been known for a long time. The TOF method needs a sample with a much larger thickness than that of an actual organic EL element. The SCLC method has a disadvantage in that electric field strength dependence of carrier mobility cannot be obtained, for example. Since an organic film required for the measurement employing the IS method is as thin as approximately several hundreds of nanometers, the film can be formed using a relatively small amount of EL materials; accordingly, the IS method is characterized by the capability of measuring the mobility with a thickness close to the thickness of a film in an actual EL element, and can also measure the electric field strength dependence of the carrier mobility.

In the IS method, a micro sinusoidal voltage signal ($V=V_0[\exp(j\omega t)]$) is applied to an EL element, and the impedance ($Z=V|I$) of the EL element is obtained from a phase difference between the current amplitude of a response current signal ($I=I_0 \exp[j(\omega t+\phi)]$) and the input signal. By applying the voltage to the element while the frequency of the voltage is changed from a high level to a low level, components having various relaxation times that contribute to the impedance can be separated and measured.

Here, admittance Y (=1/Z), which is the reciprocal number of the impedance, can be represented by conductance G and susceptance B as shown in the following formula (1).

[Formula 1]

$$Y = \frac{1}{Z} = G + jB \tag{1}$$

In addition, by a single injection model, calculation of the following formulae (2) and (3) can be performed. Here, g (the formula (4)) is differential conductance. In the formula, C represents capacitance, θ is ωt and represents a transit angle, ω represents angular frequency, and t represents transit time. For the analysis, the current equation, the Poisson's equation, and the current continuity equation are used, and a diffusion current and a trap state are ignored.

[Formula 2]

$$G = \frac{g\theta^3}{6} \frac{\theta - \sin\theta}{(\theta - \sin\theta)^2 + \left(\frac{\theta^2}{2} + \cos\theta - 1\right)^2} \tag{2}$$

$$B = \omega C = \frac{g\theta^3}{6} \frac{\frac{\theta^2}{2} + \cos\theta - 1}{(\theta - \sin\theta)^2 + \left(\frac{\theta^2}{2} + \cos\theta - 1\right)^2} \tag{3}$$

$$g = \frac{9}{4}\varepsilon\mu\frac{V_0}{d^3} \tag{4}$$

A method for calculating mobility from the frequency characteristics of capacitance is a −ΔB method. A method for calculating mobility from the frequency characteristics of conductance is a ωΔG method.

Figure 9:
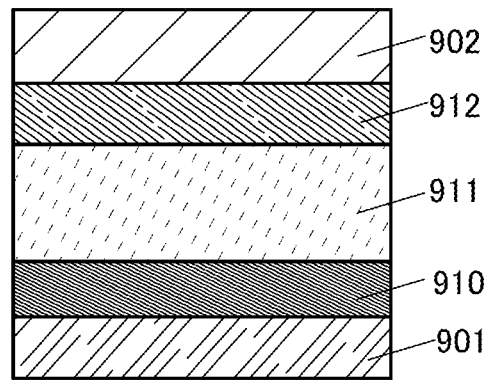
FIG. 9 is a diagram illustrating a structure of an electron-only element.

In practice, first, an electron-only element is fabricated using a material whose electron mobility is intended to be calculated. The electron-only element is an element designed such that only electrons flow therein as carriers. In this specification, the method for calculating mobility from the frequency characteristics of capacitance (the −ΔB method) is described. FIG. 9 is a schematic diagram of an electron-only element that was used.

The electron-only element fabricated for the measurement in this example includes a first layer 910, a second layer 911, and a third layer 912 between a first electrode 901 and a second electrode 902, as illustrated in FIG. 9. The material whose electron mobility is intended to be calculated is used as a material for the second layer 911. For explanation, an example in which the electron mobility of a film formed by co-evaporation of 2-{4-[9,10-di(naphthalen-2-yl)-2-anthryl]phenyl}-1-phenyl-1H-benzimidazole (abbreviation: ZADN) and Liq in a weight ratio of 1:1 is measured is given. A specific structure example is listed in the following table.

TABLE 1

| Anode | | | First layer | Second layer | Third layer | Cathode |
|---|---|---|---|---|---|---|
| 100 nm | 50 nm | 100 nm | 1 nm | 200 nm | 1 nm | 100 nm |
| APC | NITO | Al | Liq | ZADN:Liq (0.5:0.5) | Liq | Al |

Figure 10:
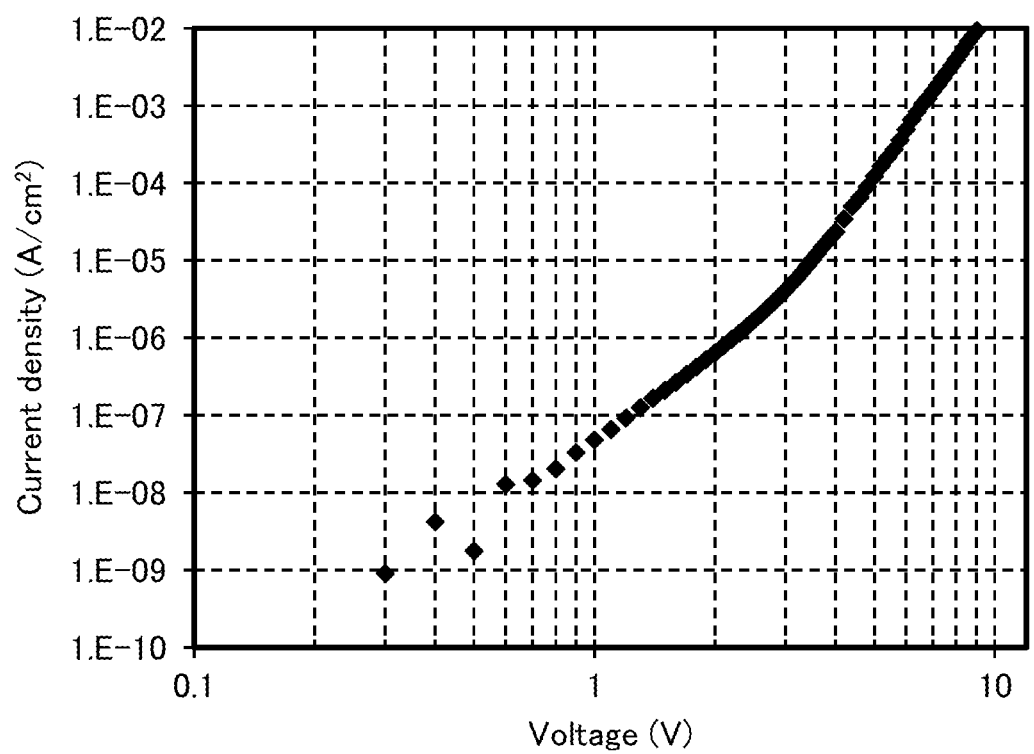
FIG. 10 shows current density-voltage characteristics of an electron-only element.

FIG. 10 shows the current density-voltage characteristics of the electron-only element using the film formed by co-evaporation of ZADN and Liq as the second layer 911.

Figure 11:
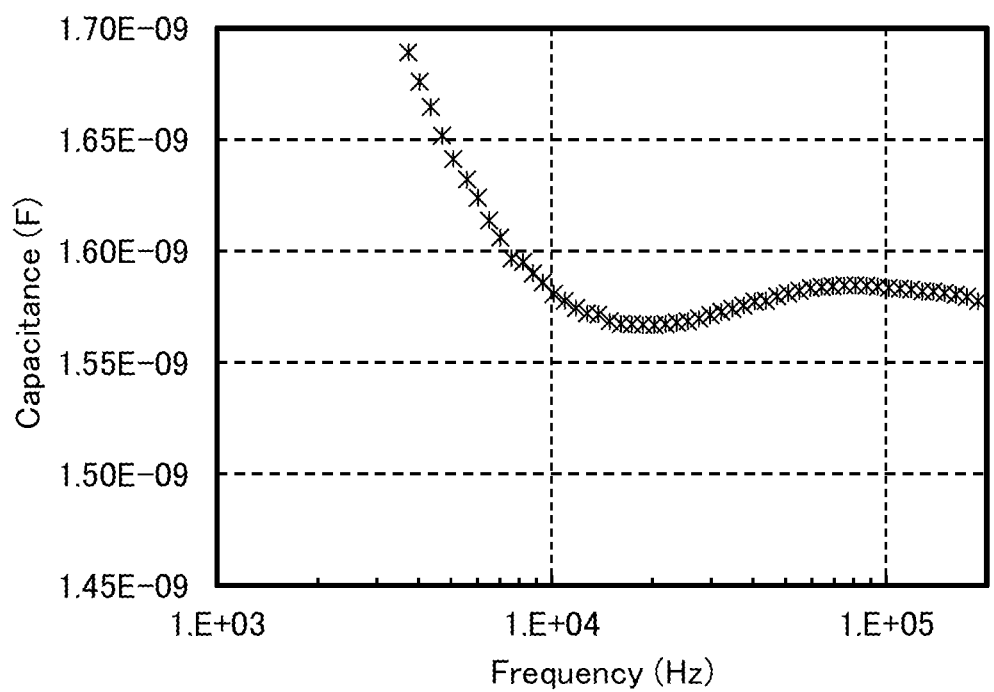
FIG. 11 shows frequency characteristics of calculated capacitance C in the case of ZADN:Liq (1:1) at a DC power of 7.0 V.

The impedance was measured under the conditions where the DC voltage was applied in the range of 5.0 V to 9.0 V, the AC voltage was 70 mV, and the frequency was 1 Hz to 3 MHz. Here, capacitance is calculated from admittance, which is the reciprocal number of the obtained impedance (the above formula (1)). FIG. 11 shows the frequency characteristics of the calculated capacitance C at an applied voltage of 7.0 V.

The frequency characteristics of the capacitance C are obtained from a phase difference in current, which is caused because a space charge generated by carriers injected by the micro voltage signal cannot completely follow the micro AC voltage. The transit time of the carriers in the film is defined by time T taken for the injected carriers to reach the counter electrode, and is represented by the following formula (5).

[Formula 3]

$$T = \frac{4}{3}\frac{L^2}{\mu V_0} \tag{5}$$

A negative susceptance change (−ΔB) corresponds to a value (−ωΔC) obtained by multiplying a capacitance change −ΔC by angular frequency ω. According to the formula (3), there is a relation between peak frequency on the lowest frequency side $f'_{max}$ ($=\omega_{max}/2\pi$) and the transit time T as shown in the following formula (6).

[Formula 4]

$$T = \frac{4.5}{2\pi f'_{max}} \quad (6)$$

Figure 12:
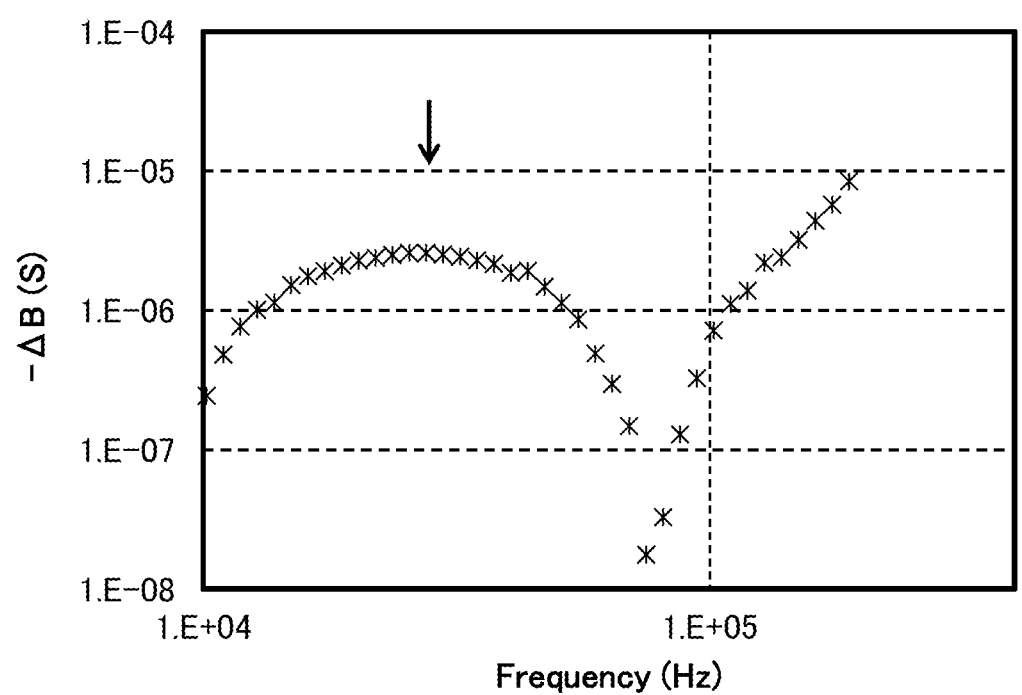
FIG. 12 shows frequency characteristics of −ΔB in the case of ZADN:Liq (1:1) at a DC voltage of 7.0 V.

FIG. 12 shows the frequency characteristics of $-\Delta B$ calculated from the above measurement (i.e., $-\Delta B$ at a DC voltage of 7.0 V). The peak frequency on the lowest frequency side $f'_{max}$ that is obtained from FIG. 12 is indicated by an arrow in the diagram.

The transit time T is obtained from $f'_{max}$ obtained from the above measurement and analysis (see the above formula (6)); thus, in this example, the electron mobility at a voltage of 7.0 V can be obtained from the above formula (5). Through the same measurement with the DC voltage in the range of 5.0 V to 9.0 V, the electron mobility at each voltage (electric field strength) can be calculated, so that the electric field strength dependence of the mobility can also be measured.

Figure 13:
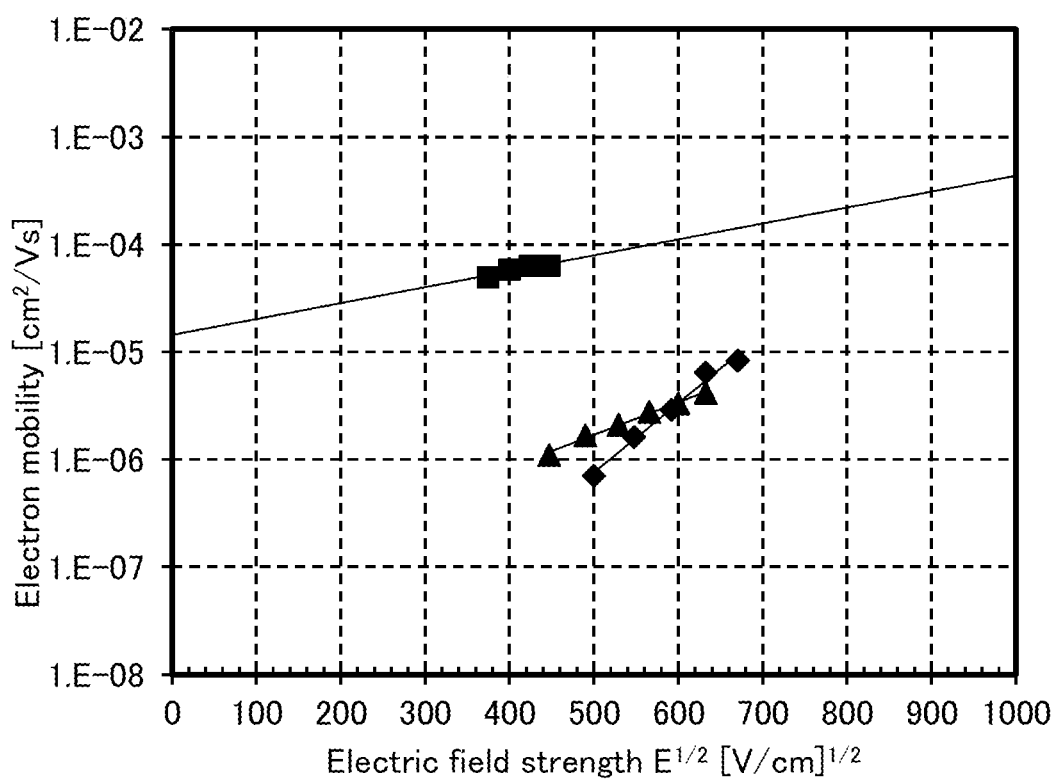
FIG. 13 shows electric field strength dependence of electron mobility of organic compounds.

FIG. 13 shows the electric field strength dependence of the electron mobility of the organic compounds, which was eventually obtained by the above calculation method, and Table 2 shows the values of the electron mobility in the case where the square root of the electric field strength [V/cm] read from the diagram was 600 $[V/cm]^{1/2}$.

TABLE 2

| | Electron mobility (cm²/Vs) |
|---|---|
| cgDBCzPA | $7.7 \times 10^{-5}$ |
| 2mDBTBPDBq-II | $2.2 \times 10^{-5}$ |
| ZADN:Liq (1:1) | $3.5 \times 10^{-6}$ |

The electron mobility can be calculated as described above. For the details about the measurement method, refer to the following reference: T. Okachi et al., *Japanese Journal of Applied Physics*, vol. 47, No. 12, 2008, pp. 8965-8972.

REFERENCE NUMERALS

101: first electrode, 102: second electrode, 103: EL layer, 111: hole-injection layer, 112: hole-transport layer, 113: light-emitting layer, 113-1: first light-emitting layer, 113-2: second light-emitting layer, 114: electron-transport layer, 115: electron-injection layer, 103a, 103b: EL layer, 104: charge-generation layer, 111a, 111b: hole-injection layer, 112a, 112b: hole-transport layer, 113a, 113b: light-emitting layer, 114a, 114b: electron-transport layer, 115a, 115b: electron-injection layer, 200R, 200G, 200B: optical path length, 201: first substrate, 202: transistor (FET), 203R, 203G, 203B, 203W: light-emitting device, 204: EL layer, 205: second substrate, 206R, 206G, 206B: color filter, 206R', 206G', 206B': color filter, 207: first electrode, 208: second electrode, 209: black layer (black matrix), 210R, 210G: conductive layer, 301: first substrate, 302: pixel portion, 303: driver circuit portion (source line driver circuit), 304a, 304b: driver circuit portion (gate line driver circuit), 305: sealant, 306: second substrate, 307: lead wiring, 308: FPC, 309: FET, 310: FET, 311: FET, 312: FET, 313: first electrode, 314: insulator, 315: EL layer, 316: second electrode, 317: light-emitting device, 318: space, 901: first electrode, 902: second electrode, 910: first layer, 911: second layer, 912: third layer, 4000: lighting device, 4001: substrate, 4002: light-emitting device, 4003: substrate, 4004: first electrode, 4005: EL layer, 4006: second electrode, 4007: electrode, 4008: electrode, 4009: auxiliary wiring, 4010: insulating layer, 4011: sealing substrate, 4012: sealant, 4013: desiccant, 4200: lighting device, 4201: substrate, 4202: light-emitting device, 4204: first electrode, 4205: EL layer, 4206: second electrode, 4207: electrode, 4208: electrode, 4209: auxiliary wiring, 4210: insulating layer, 4211: sealing substrate, 4212: sealant, 4213: barrier film, 4214: planarization film, 5101: light, 5102: wheel, 5103: door, 5104: display portion, 5105: steering wheel, 5106: shifter, 5107: seat, 5108: inner rearview mirror, 5109: windshield, 7000: housing, 7001: display portion, 7002: second display portion, 7003: speaker, 7004: LED lamp, 7005: operation key, 7006: connection terminal, 7007: sensor, 7008: microphone, 7009: switch, 7010: infrared port, 7011: recording medium reading portion, 7014: antenna, 7015: shutter button, 7016: image receiving portion, 7018: stand, 7020: camera, 7022, 7023: operation button, 7024: connection terminal, 7025: band, 7026: microphone, 7029: sensor, 7030: speaker, 7052, 7053, 7054: information, 9310: portable information terminal, 9311: display portion, 9312: display region, 9313: hinge, 9315: housing This application is based on Japanese Patent Application Serial No. 2019-028421 filed on Feb. 20, 2019, the entire contents of which are hereby incorporated herein by reference.

The invention claimed is:

1. A light-emitting device comprising:
an anode;
a cathode; and
an EL layer between the anode and the cathode,
wherein the EL layer comprises a hole-injection layer, a hole-transport layer, a light-emitting layer, and an electron-transport layer,
wherein the hole-injection layer is in contact with the anode,
wherein the light-emitting layer comprises a first light-emitting layer and a second light-emitting layer,
wherein the first light-emitting layer is in contact with the hole-transport layer,
wherein the second light-emitting layer is in contact with the electron-transport layer,
wherein the first light-emitting layer comprises a first compound and a second compound,
wherein the second light-emitting layer comprises a third compound and a fourth compound,
wherein the hole-injection layer comprises a fifth compound and a sixth compound,
wherein the fifth compound has an electron-withdrawing group,
wherein the sixth compound has a HOMO level higher than or equal to −5.7 eV and lower than or equal to −5.4 eV,
wherein the hole-transport layer comprises a seventh compound,
wherein the seventh compound has a HOMO level lower than the HOMO level of the sixth compound and higher than a HOMO level of the second compound,
wherein the electron-transport layer comprises an eighth compound and a ninth compound,
wherein the eighth compound is an organometallic complex of an alkali metal or an alkaline earth metal, and
wherein the ninth compound has a HOMO level higher than or equal to −6.0 eV.

2. The light-emitting device according to claim 1,
wherein each of the first light-emitting layer and the second light-emitting layer emits blue light.

3. The light-emitting device according to claim 1,
wherein the electron-transport layer comprises a first portion and a second portion,
wherein the second portion is located between the first portion and the cathode, and
wherein a ratio of the eighth compound to the ninth compound in the electron-transport layer differs between the first portion and the second portion.

4. The light-emitting device according to claim 3,
wherein a proportion of the eighth compound in the electron-transport layer is lower in the second portion than in the first portion.

5. The light-emitting device according to claim 1,
wherein the first compound and the third compound are the same light-emitting compound.

6. The light-emitting device according to claim 1,
wherein the second compound and the fourth compound are the same compound.

* * * * *